(12) United States Patent
Aoki

(10) Patent No.: US 7,245,522 B2
(45) Date of Patent: Jul. 17, 2007

(54) MAGNETIC MEMORY DEVICE, METHOD FOR WRITING MAGNETIC MEMORY DEVICE AND METHOD FOR READING MAGNETIC MEMORY DEVICE

(75) Inventor: Masaki Aoki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 93 days.

(21) Appl. No.: 11/081,524

(22) Filed: Mar. 17, 2005

(65) Prior Publication Data

US 2006/0139991 A1    Jun. 29, 2006

(30) Foreign Application Priority Data

Dec. 27, 2004    (JP)    ............... 2004-376226

(51) Int. Cl.
*G11C 11/00*    (2006.01)
*G11C 7/02*    (2006.01)
(52) U.S. Cl. ...................... 365/158; 365/209
(58) Field of Classification Search ................. 365/158
See application file for complete search history.

(56) References Cited

U.S. PATENT DOCUMENTS

| | | | | |
|---|---|---|---|---|
| 6,473,336 | B1 * | 10/2002 | Nakajima et al. | 365/171 |
| 6,862,228 | B2 * | 3/2005 | Hung et al. | 365/189.09 |
| 6,914,808 | B2 * | 7/2005 | Inaba | 365/158 |
| 6,930,911 | B2 * | 8/2005 | Ezaki et al. | 365/158 |
| 2006/0039183 | A1 * | 2/2006 | Lin et al. | 365/158 |

FOREIGN PATENT DOCUMENTS

| | | |
|---|---|---|
| JP | 2001-236781 | 8/2001 |
| JP | 2001-273758 | 10/2001 |
| JP | 2003-197876 | 7/2003 |
| JP | 2004-30822 | 1/2004 |

OTHER PUBLICATIONS

Roy Scheuertein et al., Digest of Technical Papers, "A 10ns read and write non-volatile memory array using a magnetic tunnel junction and FET switch in each cell", ISSCC, Feb. 8, 2000, pp. 128-129.
M. Durlam et al., "A low power 1Mbit MRAM based on IT1MTJ bit cell integrated with copper interconnects", Symposium on VLSI Circuits Dig. Tech. Papers, pp. 158-161, 2002.
N. Tanabe et al., "High density 1T/2C cell with Vcc/2 reference level for high stable FeRAMs", IEDM Tech. Dig., pp. 863-866, 1997.

* cited by examiner

*Primary Examiner*—Son L. Mai
(74) *Attorney, Agent, or Firm*—Westerman, Hattori, Daniels & Adrian, LLP.

(57)    ABSTRACT

The magnetic memory device comprises: a memory cell including two magnetoresistive effect elements serially connected to each other, and a select transistor connected to a connection node between the two magnetic resistant devices, a bit line connected to the connection node of the magnetoresistive effect elements via the select transistor, and a read circuit for reading information memorized in the magnetoresistive effect elements, based on a voltage of the connection node outputted to the bit line.

14 Claims, 19 Drawing Sheets

MAGNETIC MEMORY DEVICE, METHOD FOR WRITING MAGNETIC MEMORY DEVICE AND METHOD FOR READING MAGNETIC MEMORY DEVICE

CROSS-REFERENCE TO RELATED APPLICATIONS

This application is based upon and claims the benefit of priority from the prior Japanese Patent Application No. 2004-376226, filed on Dec. 27, 2004, the entire contents of which are incorporated herein by reference.

BACKGROUND OF THE INVENTION

The present invention relates to a magnetic memory device, more specifically a magnetic memory device using resistance changes due to spin directions of a magnetic layer, and methods for reading and writing the magnetic memory device.

Recently, as a rewritable nonvolatile memory a magnetic random access memory (hereinafter called an MRAM) including magnetoresistive effect elements arranged in a matrix is noted. The MRAM uses combinations of magnetization directions of two magnetic layers to memorize information and, to read the information, detects resistance changes (i.e., current changes or voltage changes) between the resistance with the magnetization directions of the two magnetic layers being parallel with each other and the resistance with the magnetization directions of the two magnetic layers being antiparallel with each other.

As one magnetoresistive effect element forming the MRAM, a magnetic tunnel junction (hereinafter called an MTJ) element is known. The MTJ is a element includes two ferromagnetic layers laid one on the other with an insulating film formed therebetween and utilizes the phenomenon that the tunneling current flowing between the magnetic layers via the tunnel insulating film is changed due to relationships between the magnetization directions of the two ferromagnetic layers.

That is, the MTJ element has low resistance when the magnetization directions of the two ferromagnetic layers are parallel with each other and has high resistance when both are antiparallel with each other. These two states are set to be data "0" and data "1" to use the MTJ element as a memory device. The MTJ element is a memory element using changes of the element resistance, so that the resistance changes must convert to voltage or current to read the memorized information.

FIG. 17 is a circuit diagram for the method for reading the conventional magnetic memory device. In the magnetic memory device shown in FIG. 17, one MOS transistor 102 and one MTJ element 104 constitute one memory cell 100 (1T-1MTJ type). The memory cell 100 is connected to the source electrode of a MOS transistor 106. The drain electrode of the MOS transistor 106 is connected to a current source 108.

A certain bias voltage Vclamp is applied to the gate electrode of the MOS transistor 106 to keep a voltage applied to the MTJ element 104 substantially constant. In this state, current is flowed from the current source 108 to the MOS transistor 106, the MTJ element 104 and the MOS transistor 102, whereby a voltage corresponding to a resistance value of the MTJ element is outputted to the drain terminal of the MOS transistor 106. That is, when the resistance of the MTJ element 104 is high, the output voltage is high, and the output voltage is low when the resistance of the MTJ element 104 is low. Such voltage changes are amplified by a sense amplifier (not shown) to be read signals.

The read circuit shown in FIG. 17 requires a large area to accommodate a large gate width of the MOS transistor 106 and the current source 108, and the sense amplifier has a large area. Accordingly, the sense amplifier cannot be accommodated at a pitch between the bit BL and the bit line/BL. To solve this problem it is proposed to make the read circuit common among a plurality of columns.

FIG. 18 shows an example of the application of the proposal to the magnetic memory device including 2T-2MTJ type memory cells each having two MOS transistors and two MTJ elements. The magnetic memory device shown in FIG. 18 includes one read circuit 110 for a plurality of bit line pairs (adjacent bit lines BL, /BL) and a column select circuit 112 for changing over the bit line pairs. Thus, the number of the read circuits 110 is made small, and the area of the read circuits as a whole is made small.

FIG. 19 shows an example of the application of the proposal to the magnetic memory device including 1T-1MTJ type memory cells. The magnetic memory device shown in FIG. 19 includes a reference cell 120 in addition to the memory cells. A plurality of bit lines BL and a bit line connected to the reference cell 120 are connected to a read circuit 122. Select transistors are provided respectively between the respective bit lines BL and the read circuit 122, so that one bit line can be selected out of the plurality of bit lines for read. Thus, the number of the read circuits 122 is made small, and the area of the read circuit as a whole is made small.

Related arts are disclosed in, e.g., Reference 1 (Japanese published unexamined patent application No. 2001-236781), Reference 2 (Japanese published unexamined patent application No. 2001-273758), Reference 3 (Japanese published unexamined patent application No. 2003-197876, Reference 4 (Japanese published unexamined patent application No. 2004-030822), Reference 5 (Roy Scheuerlein et al., "A 10 ns read and write non-volatile memory array using a magnetic tunnel junction and FET switch in each cell", ISSCC Dig. Tech. Papers, pp. 128-129, 2000), Reference 6 (M. Durlam et al., "A low power 1 Mbit MRAM based on 1T1MTJ bit cell integrated with copper interconnects", Symposium on VLSI Circuits Dig. Tech. Papers, pp. 158-161, 2002), and Reference 7 (N. Tanabe et al., "A high density 1T/2C cell with Vcc/2 reference level for high stable FeRAMs", IEDM Tech. Dig., pp. 863-866, 1997).

However, the 2T-2MJT type magnetic memory device shown in FIG. 18 includes a large number of devices forming one memory cell, which makes it difficult to improve the integration degree.

On the other hand, the 1T-1MTJ type magnetic memory device shown in FIG. 19 can increase the integration degree more easily than the magnetic memory device shown in FIG. 18. The reference cell 120 generates reference signals, so that fluctuation of the reference cell 120 directly influences the read margin. Especially, because of one reference cell 120 for a plurality of bit lines, some of the bit lines are near the reference cell 120, and others of the bit lines are remote from the reference cell 120. The fluctuation of characteristics of the MTJ elements is very influential. This makes it impossible to read by the differential amplification using pairs of adjacent bit lines, which is characteristically good against noises, resultantly with a risk of reduced noise resistance.

SUMMARY OF THE INVENTION

An object of the present invention is to provide a magnetic memory device which can be highly integrated, has sufficient read margin against the fluctuation of characteristics of the MTJ elements, and has high noise resistance in the memory operation, and methods for writing and reading the magnetic memory device.

According to one aspect of the present invention, there is provided a magnetic memory device comprising: a memory cell including: a first magnetoresistive effect element; a second magnetoresistive effect element serially connected to the first magnetoresistive effect element; and a select transistor connected to a connection node between the first magnetoresistive effect element and the second magnetoresistive effect element; a bit line connected to the connection node between the first magnetoresistive effect element and the second magnetoresistive effect element via the select transistor; and a read circuit connected to the bit line for reading memorized information in the memory cell defined by a resistance state of the first magnetoresistive effect element and a resistance state of the second magnetoresistive effect element based on a voltage of the connection node.

According to another aspect of the present invention, there is provided a magnetic memory device comprising: a plurality of memory cells laid out in a matrix each including: a first magnetoresistive effect element; a second magnetoresistive effect element having one end connected to one end of the first magnetoresistive effect element; and a select transistor connected to a connection node between the first magnetoresistive effect element and the second magnetoresistive effect element; a plurality of first signal lines extended in a first direction and in parallel with each other, each of the first signal lines being connected to the other ends of the first magnetoresistive effect elements of the memory cells laid out in the first direction; a plurality of second signal lines laid out in the first direction and in parallel with each other, each of the second signal lines being connected to the other ends of the second magnetoresistive effect elements of the memory cells laid in the first direction; a plurality of third signal lines laid out in a second direction normal to the first direction and in parallel with each other, each of the third signal lines intersecting the first signal lines in regions where the first magnetoresistive effect elements of the memory cells laid out in the second direction are formed and intersecting the second signal lines in regions where the second magnetoresistive effect elements of the memory cells laid out in the second direction are formed; a plurality of bit lines laid out in the second direction and in parallel with each other, each of the bit lines being connected, via the select transistors, to the connection nodes of the memory cells laid out in the second direction; and a plurality of read circuits disposed at one ends of said plurality of bit lines for the respective couples of the adjacent ones of the bit lines.

According to further another aspect of the present invention, there is provided a method for reading a magnetic memory device comprising: a memory cell including: a first magnetoresistive effect element; a second magnetoresistive effect element serially connected to the first magnetoresistive effect element; and a select transistor connected to a connection node between the first magnetoresistive effect element and the second magnetoresistive effect element; and a bit line connected to the connection node between the first magnetoresistive effect element and the second magnetoresistive effect element via the select transistor, reading a memorized information defined by a resistance state of the first magnetoresistive effect element and a resistance state of the second magnetoresistive effect element based on a voltage of the connection node outputted to the bit line when a read voltage is applied to a serial connection of the first magnetoresistive effect element and the second magnetoresistive effect element.

According to further another aspect of the present invention, there is provided a method for writing a magnetic memory device comprising: a memory cell including a first magnetoresistive effect element, a second magnetoresistive effect element serially connected to the first magnetoresistive effect element, and a select transistor connected to a connection node between the first magnetoresistive effect element and the second magnetoresistive effect element; a bit line connected to the connection node between the first magnetoresistive effect element and the second magnetoresistive effect element via the select transistor; a first signal line connected to one end of the first magnetoresistive effect element, which is opposite to the connection node with the second magnetoresistive effect element; a second signal line connected to one end of the second magnetoresistive effect element opposed to the connection node with the first magnetoresistive effect element; and a third signal line disposed near the first magnetoresistive effect element and the second magnetoresistive effect element, writing in the first magnetoresistive effect element a first resistance state by a synthesized magnetic field of a magnetic field generated by current flowing in the first signal line and a magnetic field generated by current flowing in the third signal line, writing in the second magnetoresistive effect element a second resistance state complementary with the first resistance state by a synthesized magnetic field of a magnetic field generated by current flowing in the second signal line and a magnetic field generated by current flowing in the third signal line.

According to the present invention, two magnetoresistive effect elements serially connected to each other and having states complementary with each other, and a select transistor connected to the connection node between these magnetoresistive effect elements form a memory cell, whereby information memorized in the magnetoresistive effect elements is read, based on a voltage of the connection node outputted to the bit line connected to the connection node between the first magnetoresistive effect element and the second magnetoresistive effect element via the select transistor, which more facilitates the integration in comparison with the conventional magnetic memory device using the current sense mode.

This allows the folded bit line structure to be used, whereby the differential signal of the adjacent bit line pair (BL, /BL) can be read by the cross-connection-type sense amplifier. This makes the magnetic memory device strong to noises in the memory operation. A sense amplifier can be provided for each column, whereby data of the respective columns is simultaneously read and latched by the sense amplifiers, whereby high-speed data transfer can be easily realized.

Pairs of magnetoresistive effect elements adjacent to each other are used, and a voltage which is a half of a read voltage is used as the reference voltage, whereby the read can be strong to the fluctuation of characteristics of the magnetoresistive effect elements.

DETAILED DESCRIPTION OF THE INVENTION

The magnetic memory device and the method for fabricating the same according to one embodiment of the present invention will be explained with reference to FIGS. 1 to 16.

Figure 1:
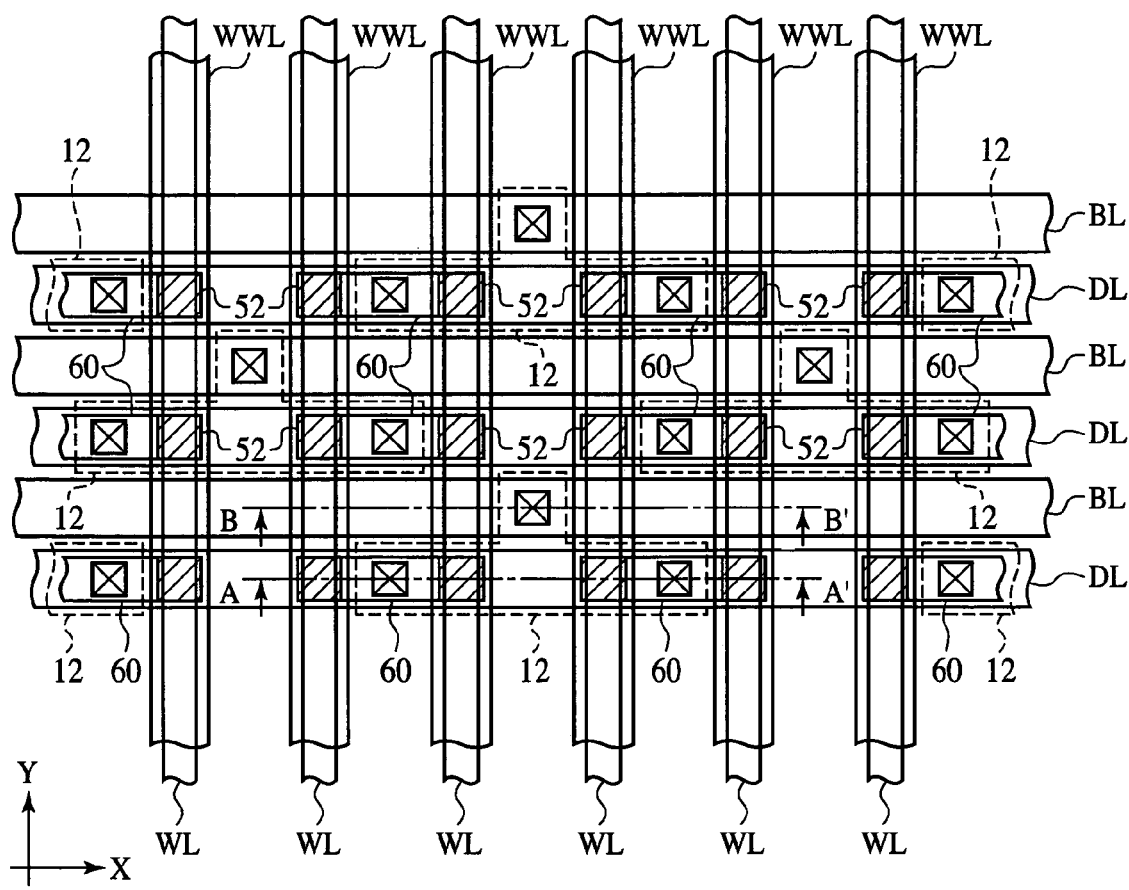
FIG. 1 is a plan view of the magnetic memory device according to one embodiment of the present invention, which shows a structure thereof.
Figure 2:
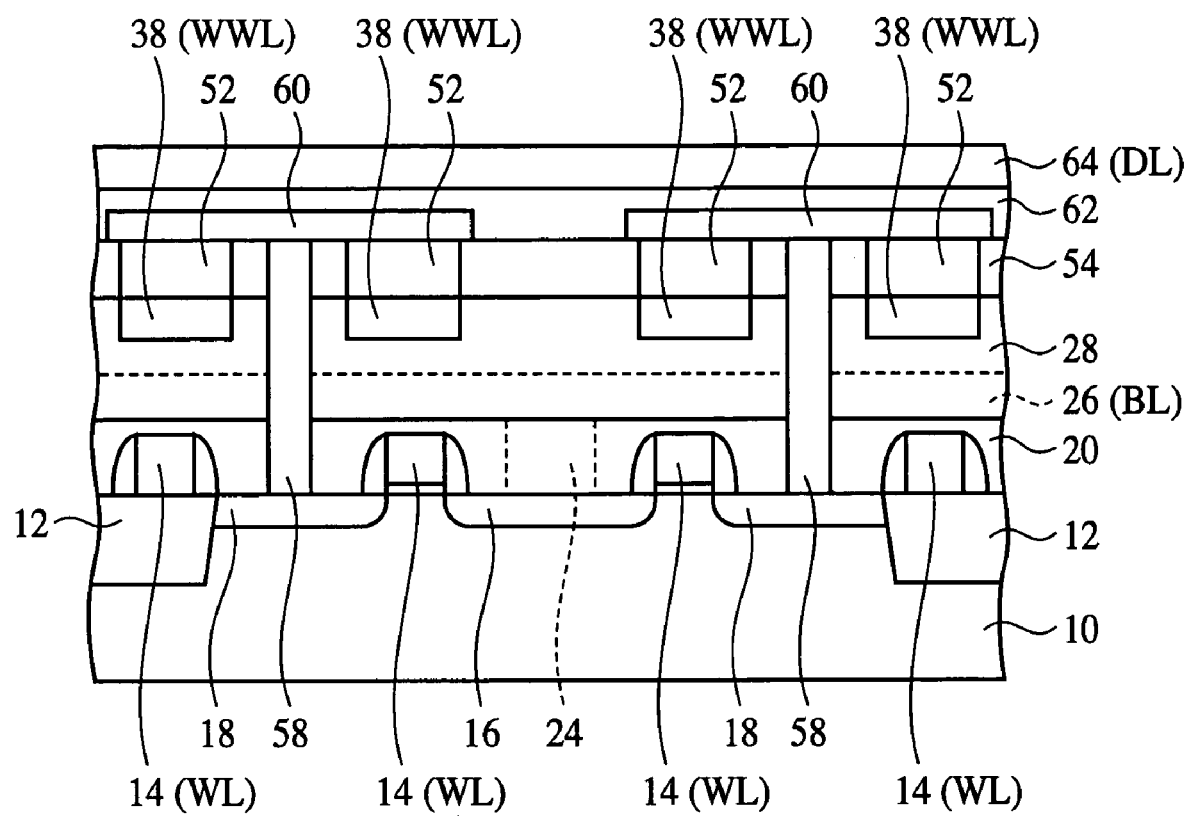
FIG. 2 is a diagrammatic sectional view of the magnetic memory device according to the embodiment of the present invention, which shows the structure thereof.
Figure 3:
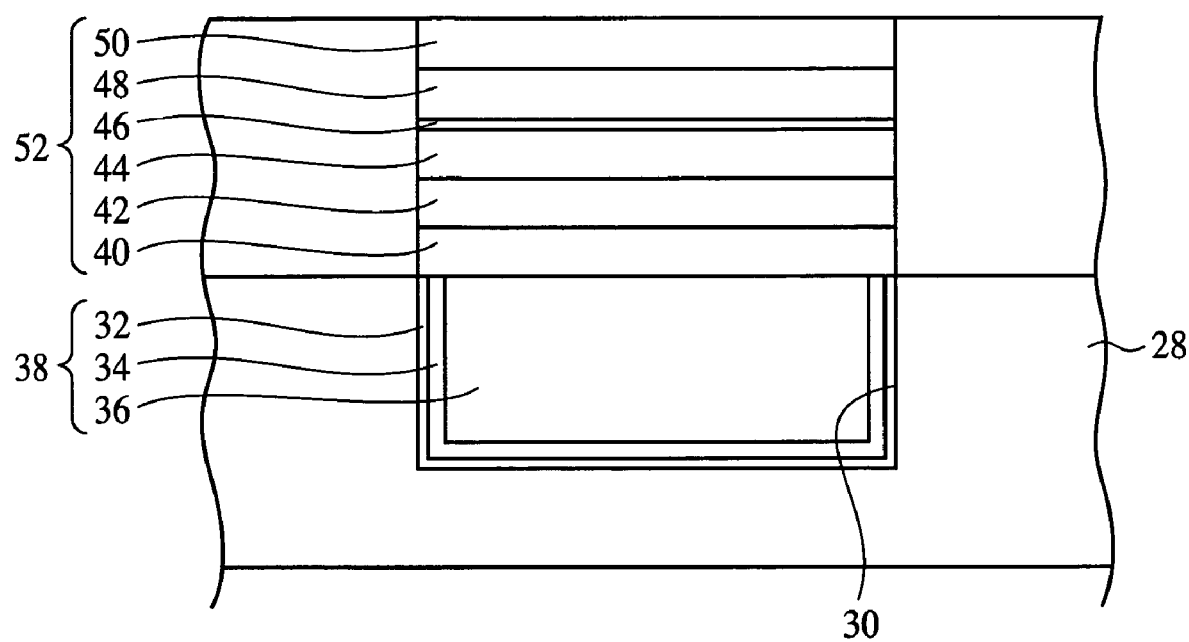
FIG. 3 is an enlarged partial sectional view of the magnetic memory device according to the embodiment of the present invention, which shows the structure thereof.
Figure 4:
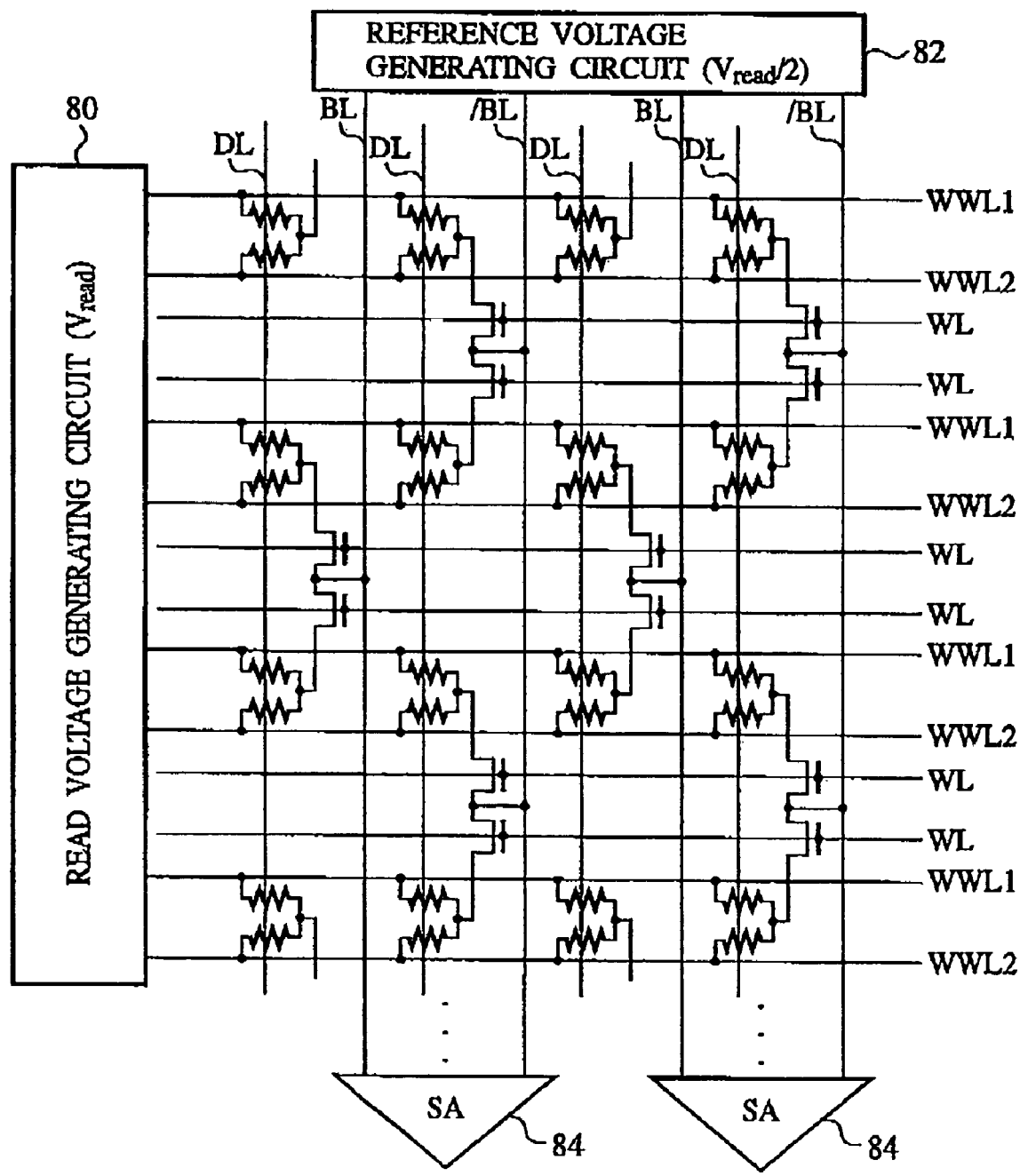
FIG. 4 is a circuit diagram of the magnetic memory device according to the embodiment of the present invention, which shows the structure thereof.

First, the structure of the magnetic memory device according to the present embodiment will be explained with reference to FIGS. 1 to 4. FIG. 1 is a plan view of the magnetic memory device according to the present embodiment, which shows the structure thereof. FIG. 2 is a diagrammatic sectional view of the magnetic memory device according to the present embodiment, which shows the structure thereof. FIG. 3 is a partial enlarged sectional view of the magnetic memory device according to the present embodiment, which shows the structure thereof. FIG. 4 is a circuit diagram of the magnetic memory device according to the present embodiment, which shows the structure thereof.

A device isolation film 12 for defining a plurality of active regions is formed on the silicon substrate 10. Each active region has a T-shaped configuration including a rectangular transistor forming part which is longer in the X-direction and a contact part which is projected in the Y-direction from the middle of the transistor forming part. The active regions are laid out zigzag with each other.

A plurality of word lines WL are formed on the silicon substrate 10 with the device isolation film 12 formed on, extended in the Y-direction. Two word lines are extended in each active region. In each active region, the source/drain regions 16, 18 are formed on both sides of the respective word lines. Thus, in each active region, two select transistors each including the gate electrode functioning also as the word line WL, and the source/drain regions 16, 18 are formed. The two select transistors formed in the same active region commonly include the source/drain region 16.

An inter-layer insulating film 20 is formed on the silicon substrate 10 with the select transistors formed on. In the inter-layer insulating film 20, contact plugs 24 connected to the source/drain regions 16 formed in the contact parts of the active regions are buried. A plurality of bit lines 26 (BL) are formed on the inter-layer insulating film 20, extended in the X-direction and electrically connected to the source/drain regions 16 via contact plugs 24. The bit lines 26 are formed, traversing the contact parts of the active regions.

An inter-layer insulating film 28 is formed on the inter-layer insulating film 20 with the bit lines 26 formed on. In the inter-layer insulating film 28, a plurality of write word lines (WWL) 38 are buried, extended in the Y-direction. The write word lines 38 are formed above the respective word lines WL. As shown in FIG. 3, the write word lines 38 are formed of a Ta film 32 as a barrier metal formed along the inside wall of interconnection trenches 30, an NiFe film 34, whose magnetic permeability is higher, formed for the purpose of strengthening the magnetic fields, and a Cu film 36 which is the major interconnection.

On the inter-layer insulating film 28 with the write word lines 38 buried in, MTJ elements 52 are formed. The MTJ elements 52 are formed respectively in the regions where the active regions and the write word line 38 intersect each other. As shown in FIG. 3, The MTJ elements 52 are formed of a lower electrode layer 40 of a Ta film, an antiferromagnetic layer 42 of a PtMn film, a ferromagnetic layer 44 of a CoFe film as pinned magnetization layer, a tunnel insulating film 46 of an alumina film, a ferromagnetic layer 48 of a CoFe film as a free magnetization layer, and a cap layer 50 of a Ta film.

An inter-layer insulating film 54 is formed on the inter-layer insulating film 28 except the region where the MTJ elements 52 are formed. In the inter-layer insulating films 54, 28, 20, contact plugs 58 connected to the source/drain diffused regions 18 are buried. On the inter-layer insulating film 54, an upper electrode layer 60 is formed, electrically connecting the two MTJ elements 52 adjacent in the X-direction with each contact plug 58 therebetween, and the contact plugs 58 with each other.

An inter-layer insulating film 62 is formed on the inter-layer insulating film 54 with the upper electrode layer 60 formed on. On the inter-layer insulating film 62, a plurality of digit lines 64 are formed, extended in the X-direction. The digit lines 64 are formed, traversing the MTJ elements 52 thereabove.

The magnetic memory device according to the present embodiment is of the 1T-2MTJ type that one memory cell includes one select transistor and two MTJ elements. This will be explained with reference to FIG. 2. When the select transistor including the second gate electrode 14 from the right side in FIG. 2 and the source/drain regions 16, 18 formed on the left and the right of the gate electrode 14 is noted, 2 MTJ elements 52 are connected to the source/drain region 18 of the select transistor via the contact plug 58 and the upper electrode layer 60. The select transistor and the MTJ elements 52 form one memory cell. Similarly, in the select transistor including the second gate electrode 14 from the left side in FIG. 2 and the source/drain regions 16, 18 formed on the left and the right of the gate electrode 14 the source/drain region 18 is connected to two MTJ elements 52 via the contact plug 58 and the upper electrode layer 60. The select transistor and the MTJ elements 52 form another memory cell. Thus, in each active region, two memory cells are formed with the bit line contact in common.

FIG. 4 is a circuit diagram of the memory cell array of the magnetic memory device according to the present embodiment. As shown, the read word lines WWL are connected to the read voltage generating circuit 80. One ends of the bit lines BL are connected to a reference voltage generating circuit 82. The other ends of the bit lines BL are connected to sense amplifiers 84. Two adjacent bit lines BL, /BL are connected to each sense amplifier 84, and form a folded bit line structure.

In the magnetic memory device according to the present embodiment, the read bit lines BL and the write digit lines DL are arranged in the same direction, but the read bit lines BL are formed of a first level metal interconnection, and the write digit lines DL are formed of a third level metal interconnection. Both can be accommodated at a 2F pitch (F is a minimum feature size). In the direction normal to the bit lines BL, two word lines are accommodated at a 4F pitch. Accordingly, the area of the unit memory cell of the magnetic memory device according to the present embodiment is $4F \times 2F = 8F^2$, which is basically equal to the area of the memory cell of 1T-1MTJ.

The method for writing the magnetic memory device according to the present embodiment will be explained with reference to FIGS. 5 to 7.

Figure 5:
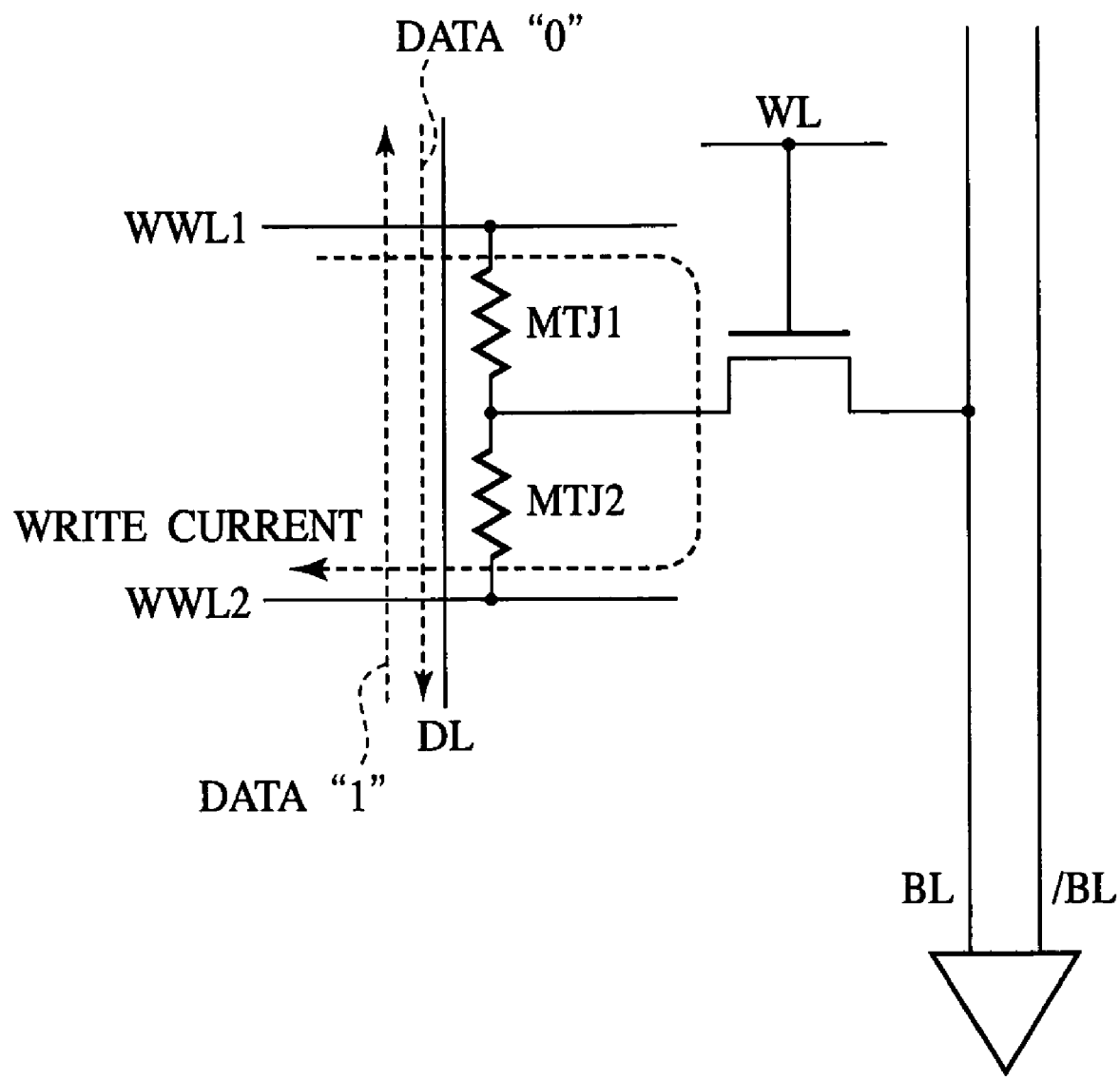
FIG. 5 is a view showing the method for writing the magnetic memory device according to the embodiment of the present invention.

FIG. 5 is a view explaining the method for writing the magnetic memory device according to the present embodiment. FIGS. 6 and 7 are circuit diagrams which show a suitable memory cell arrangement for the method for writing the magnetic memory device according to the present embodiment.

As described above, the magnetic memory device according to the present embodiment includes 1T-2MTJ type memory cells. In the two MTJ elements included in one memory cell, information is written so that the two MTJ elements complementarily have a state of high resistance (a high resistance state) and a state of low resistance (a low resistance state). That is, in one of the MTJ elements, the magnetization direction of the ferromagnetic layer 44 as the pinned magnetization layer is opposite to the magnetization direction of the ferromagnetic layer 48 as the free magnetization layer (the high resistance state), and in the other of the MTJ elements, the magnetization direction of the ferromagnetic layer 44 as the pinned magnetization layer is the same as the magnetization direction of the ferromagnetic layer 40 as the free magnetization layer (the low resistance state).

Then, as shown in FIG. 5, the write word line WWL1 connected to one MTJ element (MTJ1) and the write word line WWL2 connected to the other MTJ elements (MTJ2) flow current in directions opposite to each other. The digit line DL flows current in a direction corresponding to information to be memorized. For example, when "0" is memorized, downward current as viewed in the drawing flows, and upward current as viewed in the drawing flows when data "1" is memorized. Data "0" and data "1" may be defined by current flows in opposite directions.

Thus, the free magnetization layers (the ferromagnetic layers 48) of the MTJ elements MTJ1, MTJ2 are magnetized in a direction corresponding to a synthesized magnetic field of a magnetic field generated by the current flowed in the write word lines WWL1, WWL2, and a magnetic field generated by the current flowed in the digit line DL. The flow direction of the current flowed in the write word line WWL1 and the flow direction of current flowed in the write word line WWL2 are opposite to each other, and the magnetization directions of the MTJ elements MTJ1, MTJ2 are opposite to each other, whereby the writing can be complementary.

Figure 6:
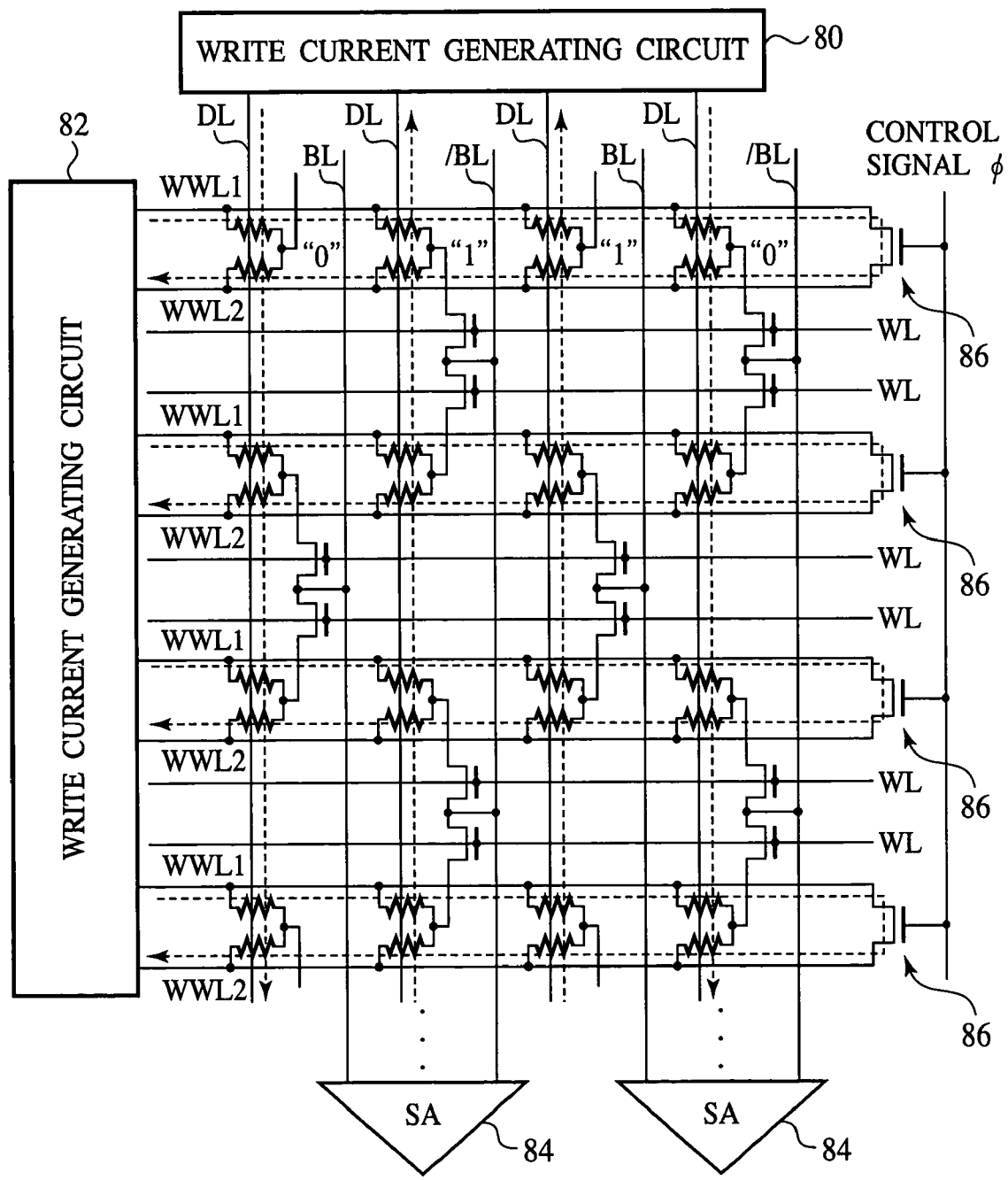
FIGS. 6 and 7 are circuit diagrams of a memory cell arrangement suitable for the method for writing the magnetic memory device according to the embodiment of the present invention.
Figure 7:
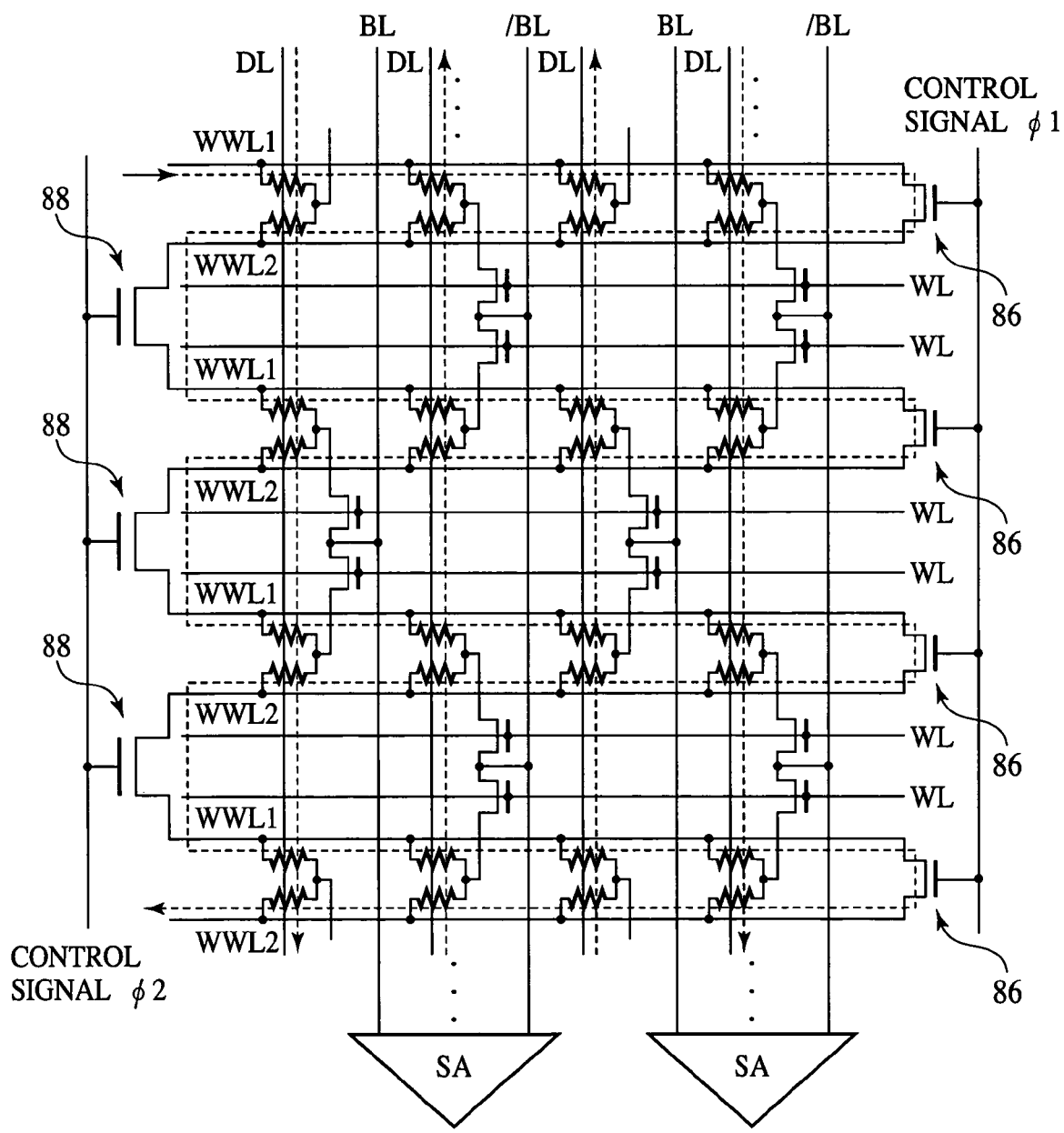

FIGS. 6 and 7 are the circuit diagrams of an arrangement suitable to make the direction of current flowed in the write word line WWL1 and the direction of current flowed in the write word line WWL2 opposite to each other.

In the circuit diagram shown in FIG. 6, at the ends of the write word lines WWL1, WWL2 on the side opposite to a write current generating circuit 82, switching elements 86 each for connecting and disconnecting the write word line WWL1 and the write word line WWL2 are provided.

The switching elements 86 are provided respectively between the write word line WWL1 and the write word line WWL2, whereby the switching elements 86 are simply turned on by control signal Φ to thereby flow current in opposite directions in the write word line WWL1 and the write word line WWL2. Thus, the write operation can be simple.

In the circuit diagram shown in FIG. 7, in addition to the switching elements 86 each for connecting and disconnecting the write word line WWL1 and the write word line WWL2 disposed at the ends of the write word lines WWL1, WWWL2, switching elements 88 each for connecting and disconnecting the write word line WWL2 and the write word line WWL1 of the memory cells adjacent to each other in the direction of extension of the bit lines BL are provided.

The switching elements 88 are additionally provided each between the write word line WWL2 and the write word line WWL1 of the memory cells adjacent to each other in the direction of the bit lines BL, and the switching elements 86, 88 are turned on by control signal Φ1 and control signal Φ2, whereby the write word lines WWL1, WWL2 of a plurality of the memory cells adjacent to each other in the direction of extension of the bit lines BL are interconnected with one another. The path of the flow of current is thus interconnected, whereby the write current can be decreased.

Next, the read method for the magnetic memory device according to the present embodiment will be explained with reference to FIGS. 8 to 12B.

Figure 8:
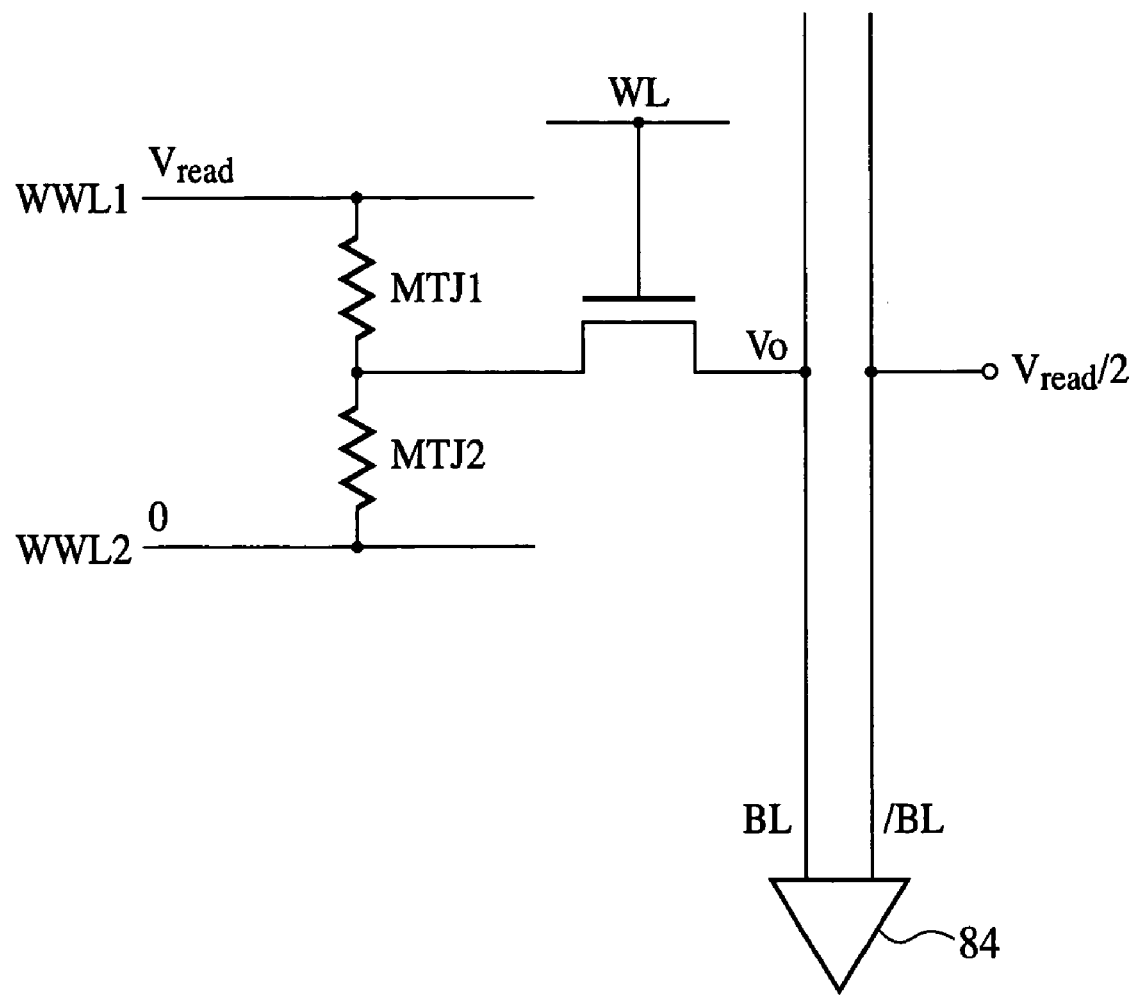
FIG. 8 is a view showing a method for reading the magnetic memory device according to the embodiment of the present invention.
Figure 9A:
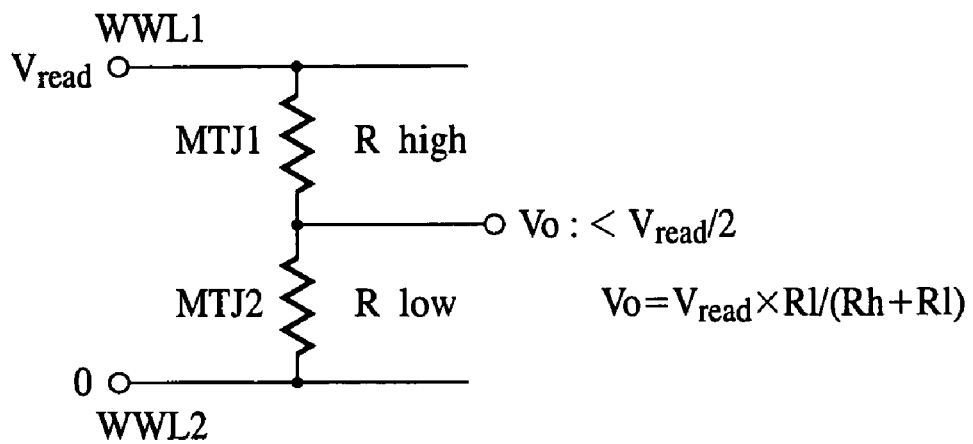
FIGS. 9A and 9B are views showing the method for judging memorized information for the magnetic memory device according to the embodiment of the present invention.
Figure 9B:
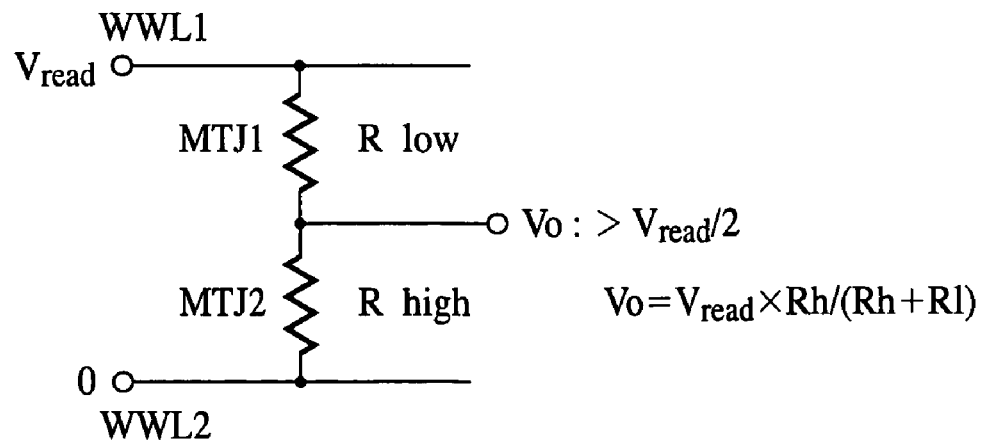
Figure 10:
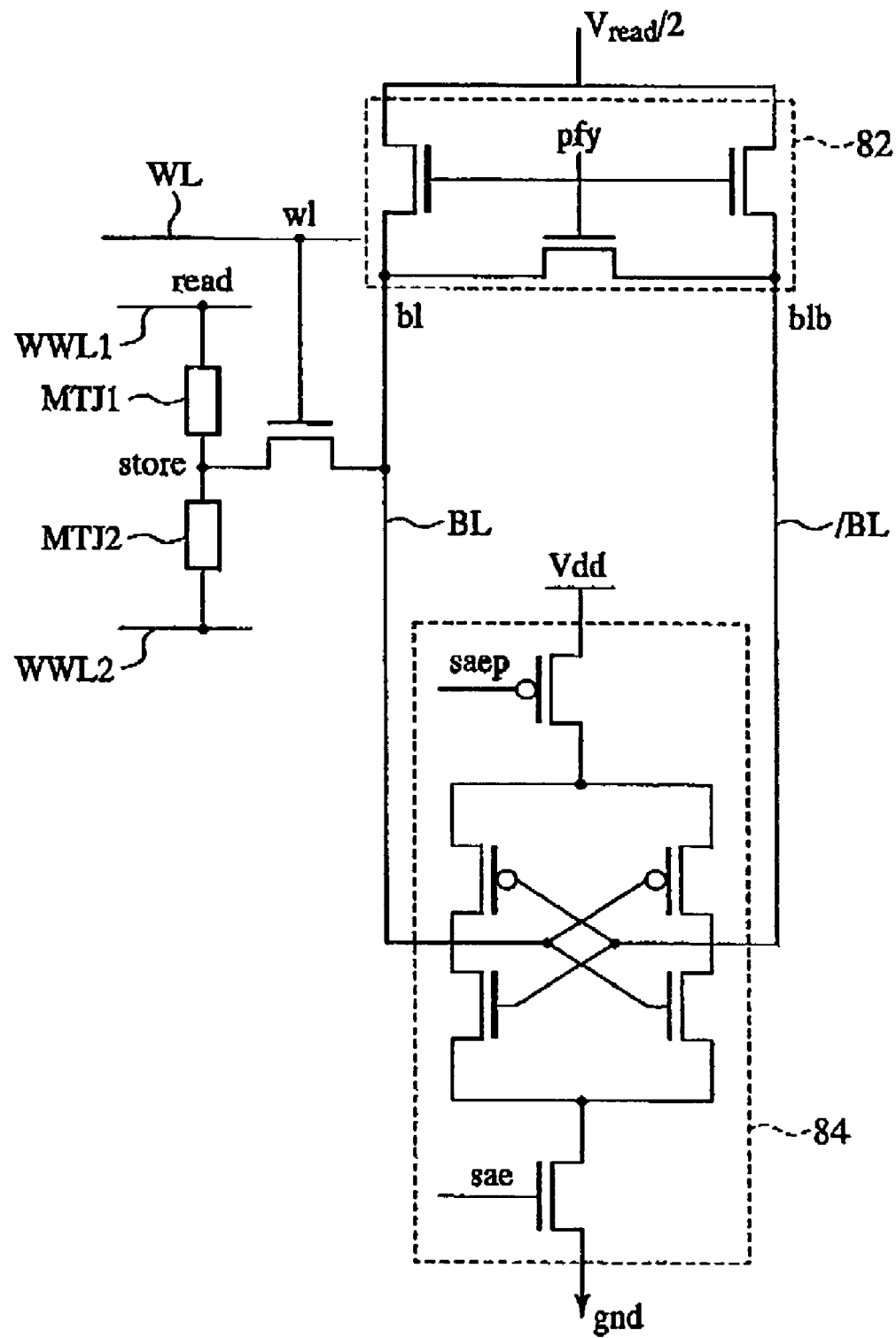
FIG. 10 is a circuit diagram of one example of the memory cell and the read circuit of the magnetic memory device according to the embodiment of the present invention.
Figure 11:
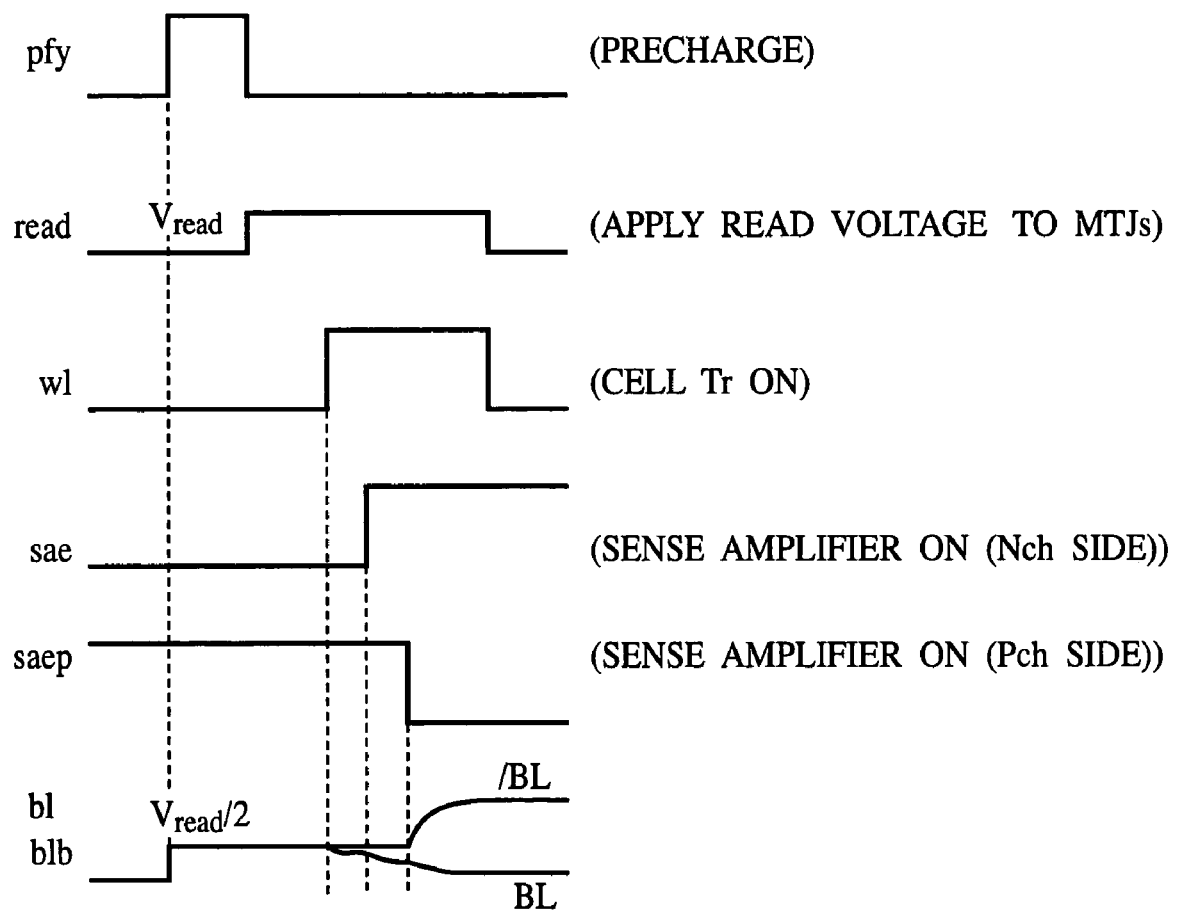
FIG. 11 is a time chart of the timing of the read operation of the magnetic memory device according to the embodiment of ,the present invention.
Figure 12A:
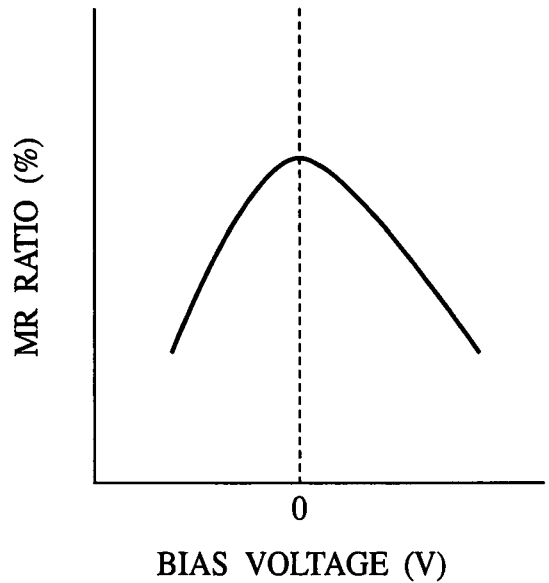
FIG. 12 consisting of FIGS. 12A and 12B are graphs showing the method for setting a read voltage of the magnetic memory device according to the embodiment of the present invention.
Figure 12B:
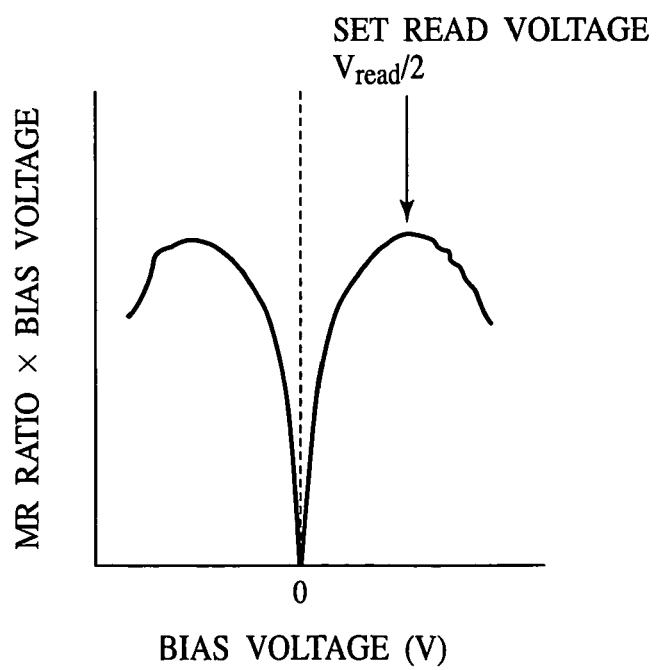

FIG. 8 is a view explaining the method for reading the magnetic memory device according to the present embodiment. FIGS. 9A and 9B are views showing the method of judging memorized information for the magnetic memory device according to the present embodiment. FIG. 10 is the circuit diagram of one example of the memory cell and the read circuit of the magnetic memory device according to the present embodiment. FIG. 11 is the timing chart of the timing of the read operation of the magnetic memory device according to the present embodiment. FIGS. 12A and 12B are graphs showing the method for setting the read voltage.

In the magnetic memory device according to the present embodiment, two MTJ elements 52 included in one memory cell are serially connected via an upper interconnection layer 60. The write word line WWL1 and the write word line WWL2 are connected respectively to both ends of the two serially connected MTJ elements MTJ1, MTJ2. Complementary information is written in the MTJ elements MTJ1, MTJ2.

In the read for the magnetic memory device according to the present embodiment, as shown in FIG. 8, a read voltage $V_{read}$ is applied to the serial connection of the MTJ elements MTJ1, MTJ2 via the write word line WWL1 and the write word line WWL2, and a voltage of the connection node between the MTJ element MTJ1 and the MTJ element MTJ2 is read to the bit line (BL) via the select transistor. At this time, a voltage applied to the write word line WWL1 is $V_{read}$, and a voltage applied to the write word line WWL2 is 0. A constant voltage of $V_{read}/2$ is applied to the bit line (/BL) on the side of the reference.

Next, a voltage of the bit line (BL) and a voltage of the bit line (/BL) on the side of the reference are compared by the differential amplification-type read sense circuit to read information memorized in the MTJ elements.

When data is "0", e.g., the MTJ element MTJ1 has high resistance state, and the MTJ element MTJ2 has low resistance state, a voltage Vo of the node between the MTJ element MTJ1 and the MTJ element MTJ2 is lower than a voltage $V_{read}/2$. Accordingly, when a voltage of the bit line (BL) is lower than a voltage of the bit line (/BL) on the side of the reference is lower, the information memorized in the MTJ elements can be judged "0" (see FIG. 9A).

Oppositely, when data is "1", e.g., the MTJ element MTJ1 has low resistance state, and the MTJ element MTJ2 has high resistance state, a voltage Vo of the node between the MTJ element MTJ1 and the MTJ element MTJ2 is higher than a voltage $V_{read}/2$. Accordingly, when a voltage of the bit line (BL) is higher than a voltage of the bit line (/BL) on the side of the reference is higher, the information memorized in the MTJ elements can be judged "1" (see FIG. 9B).

Then, the read circuit and its operation will be specifically explained with reference to FIGS. 10 and 11.

FIG. 10 is a circuit diagram of one example of the memory cell and the read circuit. As described above, two MTJ elements MTJ1, MTJ2 are serially connected, and the connection node between them is connected to the bit line BL. One ends of the bit lines BL, /BL are connected to the differential amplification-type sense amplifier 84. The sense amplifier shown in FIG. 10 is a cross connection-type sense amplifier which is ordinarily used in DRAMs. The other ends of the bit lines BL, /BL are connected to a constant voltage source of $V_{read}/2$ via a precharge circuit 86 which prechares these signal lines.

FIG. 11 is a timing chart of the timing of the read operation. In FIG. 11, pfy indicates a voltage applied to the precharge circuit 82; read indicates a voltage applied to the write word line WWL1; wl indicates a voltage applied to the word line WL; sae indicates a voltage applied to the Nch transistor of the sense amplifier 84; saep indicates a voltage applied to the Pch transistor of the sense amplifier 84; bl indicates a voltage of the bit line BL; and blb indicates a voltage of the bit line /BL on the side of the reference. The indications of the respective nodes are found in FIG. 10.

First, a control voltage for the precharge is applied to the control terminal (pfy) of the precharge circuit 82, and all the transistors of the precharge circuit 82 are tuned on. The voltage of the bit line BL (bl) and the voltage of the bit line /BL on the side of the reference (blb) are precharged to the voltage Vread/2 supplied by the constant voltage source.

Next, after the bit line BL and the bit line /BL on the side of the reference have been precharged, the control voltage for the precharge being applied to the control terminal (pfy) of the precharge circuit 82 is turned off.

Next, the read voltage $V_{read}$ is applied between the write word line WWL1 and the write word line WWL2. For example, the voltage of the write word line WWL1 (read) is $V_{read}$, and the voltage of the write word line WWL2 is 0.

Then, the control voltage for turning on the select transistor is applied to the word line WL (wl). Thus, the select transistor is turned on, the voltage of the bit line BL (bl) becomes the voltage of the connection node between the 2 MTJ elements MTJ1, MTJ2. The voltage of the bit line /BL on the side of the reference remains the voltage $V_{read}/2$.

In FIG. 11, data "0", i.e., the MTJ element MTJ1 has high resistance state, and the MTJ element MTJ2 has low voltage state is assumed, the voltage of the bit line BL (bl) is lower than the voltage $V_{read}/2$. When data is "1", the MTJ element MTJ1 has low resistance state, and the MTJ element MTJ2 has high resistance state, the voltage of the bit line BL (bl) is higher than the voltage $V_{read}/2$.

Then, with the voltages of the read word line WWL1 and the word line WL (read, wl) retained, the N channel transistor and the P channel transistor are sequentially turned on. Thus, the voltage of that of the bit lines BL and the bit line /BL on the side of the reference, whose voltage is higher is raised to the source voltage Vdd, and the voltage of that of the signal lines, whose voltage is low is lowered to the earth voltage. Accordingly, which of the bit line BL and the bit line /BL on the side of the reference has higher voltage can be easily detected, and information memorized in the memory cell can be read.

Next, the method for setting the read voltage $V_{read}$ will be explained with reference to FIG. 12.

Generally, the resistance of the magnetoresistive effect elements tends to be smaller as the applied voltage is higher. The change ratio of the resistance, the MR ratio (MR ratio=$(R_{high}-R_{low})/R_{low}$) also depends on the voltage and is smaller as the applied voltage is higher (see FIG. 12A).

The read margin $\Delta V_{sig}$ of the magnetic memory device according to the present embodiment is expressed as follows.

$$\Delta V_{sig} = V_o - V_{read}/2$$
$$= V_{read} \times R_{high}/(R_{high} + R_{low}) - V_{read}/2$$
$$= (V_{read}/2) \times \{(R_{high} - R_{low})/(R_{high} + R_{low})\}$$
$$\approx (V_{read}/2) \times MR \text{ ratio} \times 1/2$$

The voltage $V_{read}$ is applied to the two serially connected MTJ elements, and about $V_{read}/2$ voltage is applied to each of the MTJ elements. Accordingly, the read margin $\Delta V_{sig}$ has a maximum value when the $(V_{read}/2) \times$MR ratio is a maximum.

Accordingly, to set the actual read voltage $V_{read}$, it is preferable that the bias voltage dependency of the MR ratio of the MTJ elements used in the memory cell is measured, and the read voltage $V_{read}$ is set so that a bias voltage which maximizes the product of the MR ratio×the bias voltage is $V_{read}/2$.

Next, the method for fabricating the magnetic memory device according to the present embodiment will be explained with reference to FIGS. 13A to 16C.

Figure 13A:
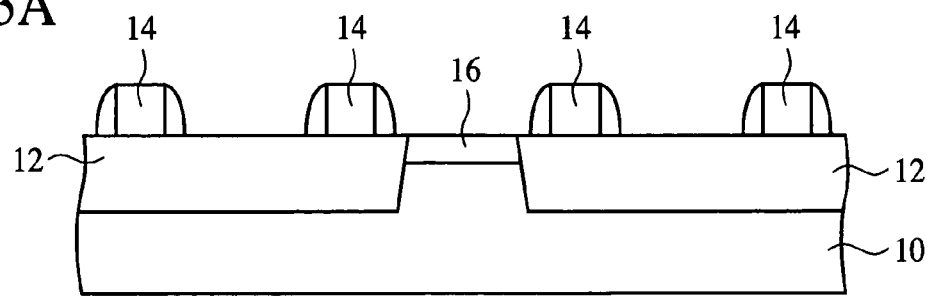
FIGS. 13A-13C, 14A-14D, 15A-15C, and 16A-16C are sectional views of the magnetic memory device according to the embodiment of the present invention in the steps of the method for fabricating the same, which show the method.

FIGS. 13A to 16C are sectional views of the magnetic memory device according to the present embodiment in the steps of the method for fabricating the same, which show the method. FIGS. 13A-13C are the sectional views along the line B-B' in FIG. 1, and FIGS. 14A to 16C are sectional views along the line A-A' in FIG. 1.

First, the device isolation film 12 is formed on the silicon substrate 10 by, e.g., STI (Shallow Trench Isolation) method. The plurality of the active regions defined by the device isolation film 12 have T-shaped.

Figure 14A:
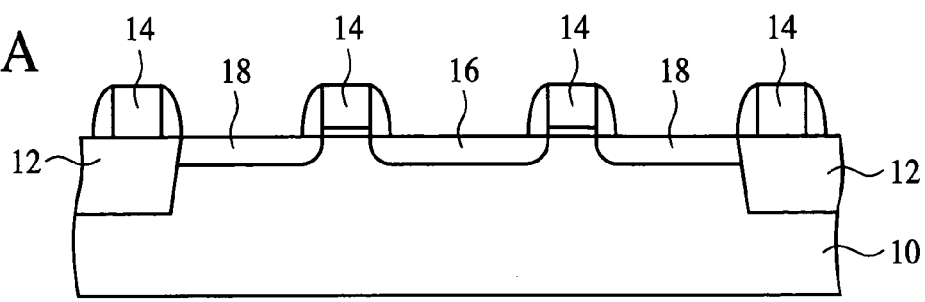

Then, in the active regions defined by the device isolation film 12, the select transistors each including the gate electrode 14 and the source/drain regions 16, 18 are formed (FIGS. 13A and 14A). Two select transistors are formed in each active region. The gate electrodes 14 are formed extending normal to the drawing and form the read word lines WL which, as shown in FIG. 1, function as the gate electrodes 14 of the plurality select transistors.

Next, on the silicon substrate 10 with the select transistors formed on, a silicon oxide film is deposited by, e.g., CVD method, and the surface of the silicon oxide film is planarized by CMP method to form the inter-layer insulating film 20 of the silicon oxide film.

Next, by photolithography and dry etching, contact holes 22 are formed in the inter-layer insulating film 20 down to the source/drain regions 16.

Figure 13B:
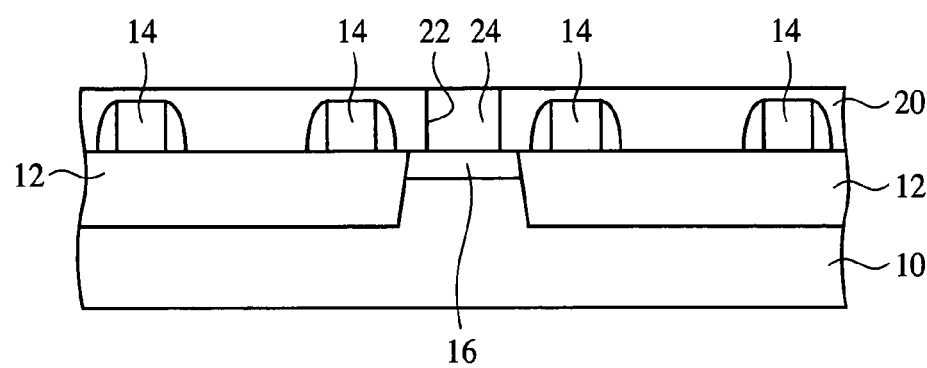
Figure 14B:
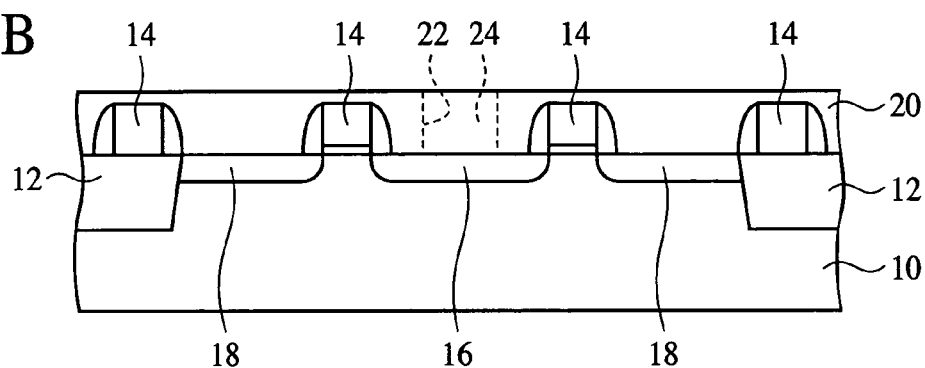

Next, by, e.g., CVD method, a titanium nitride film as a barrier metal and a tungsten film are deposited, and then these conducing films are etched back or polished back to form the contact plugs 24, buried in the contact holes 22 and electrically connected to the source/drain regions 16 (FIGS. 13B and 14B).

Then, a conducting film is deposited on the inter-layer insulating film 20 with the contact plugs 24 buried in and is patterned to form the bit lines 26 electrically connected to the source/drain regions 16 via the contact plugs 24. The bit lines 26 (BL) are formed, extended to cross the word lines WL.

Figure 13C:
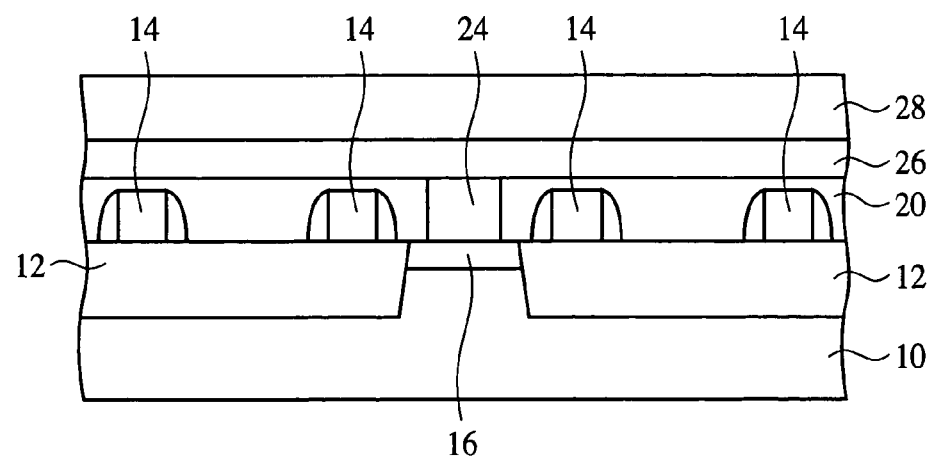
Figure 14C:
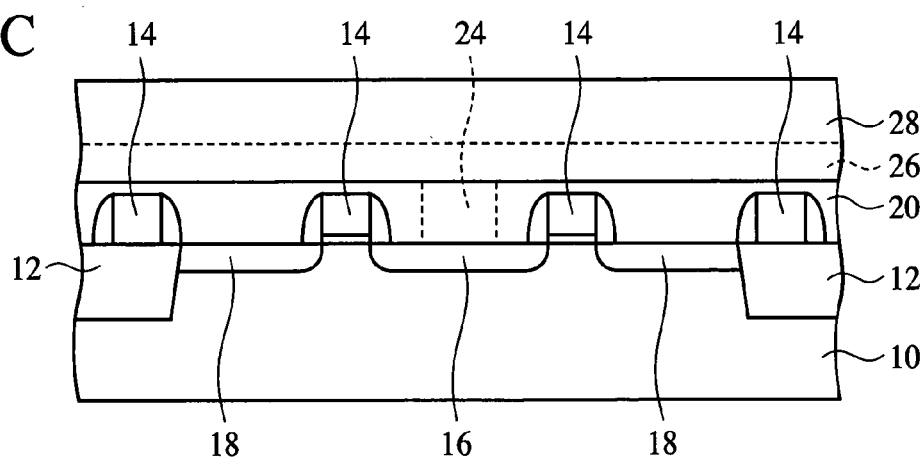

Next, on the inter-layer insulating film 20 with the bit lines 26 formed on, a silicon oxide film is deposited by, e.g., CVD method, and the surface of the silicon oxide film is planarized by CMP method to form the inter-layer insulating film 28 of the silicon oxide film (FIGS. 13C and 14C).

Figure 14D:
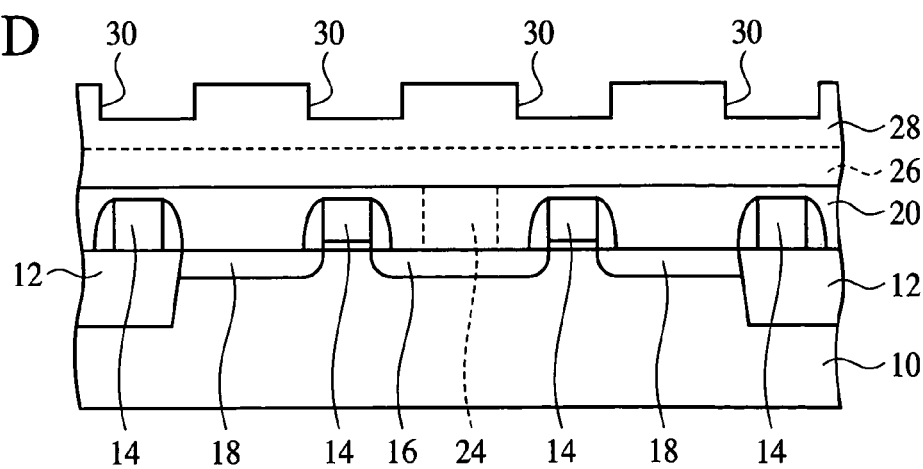

Next, by photolithograph and etching interconnection trenches 30 for the write word lines to be buried in is formed in the inter-layer insulating film 28. (FIG. 14D).

Figure 15A:
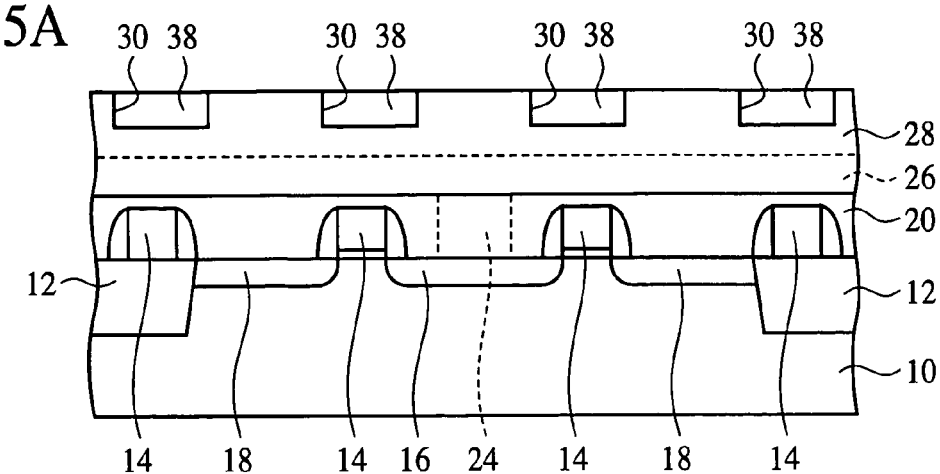

Then, a Ta film 32 and an NiFe film 34, and a Cu film 36 are deposited respectively, e.g., by sputtering method and electrolytic plating method, and these conducting films are planarized by CMP method to form the write word lines 38 buried in the interconnection trenches 30 (FIGS. 3 and 15A). As shown in FIG. 1, the write word lines 38 (WWL) are formed, extended in parallel with the extension of the word lines WL.

Next, on the inter-layer insulating film 28 with the write word lines 38 buried in, the lower electrode layer 40 of, e.g., a Ta film, the antiferromagnetic layer 42 of, e.g., PtMn, the ferromagnetic layer 44 of, e.g., CoFe, the tunnel insulating film of, e.g., alumina, the ferromagnetic layer 48 of, e.g., NiFe, and the cap layer 50 of, e.g., a Ta film are formed.

Figure 15B:
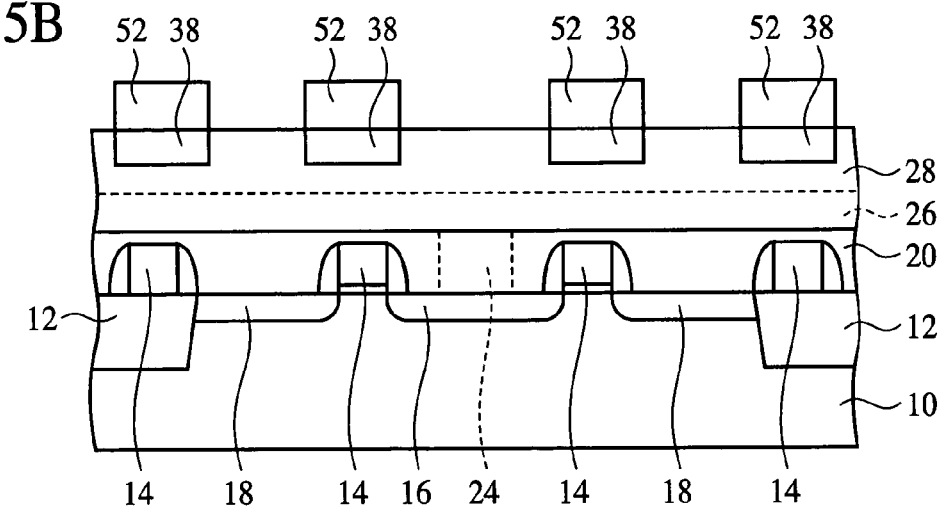

Next, by photolithography and dry etching, the cap layer 50, the ferromagnetic layer 48, the tunnel insulating film 46, the ferromagnetic layer 44, the antiferromagnetic layer 42 and the lower electrode layer 40 are patterned to form the MTJ elements 52 connected to the write word lines 38 (FIGS. 3 and 15B). In patterning the cap layer 50 and the lower electrode layer 40, a $Cl_2$/Ar-based etching gas, for example, is used, and a $CO/NH_3$-based etching gas, for example, is used in patterning the ferromagnetic layer 48, the tunnel insulating film 46, the ferromagnetic layer 44 and the antiferromagnetic layer 42.

Figure 15C:
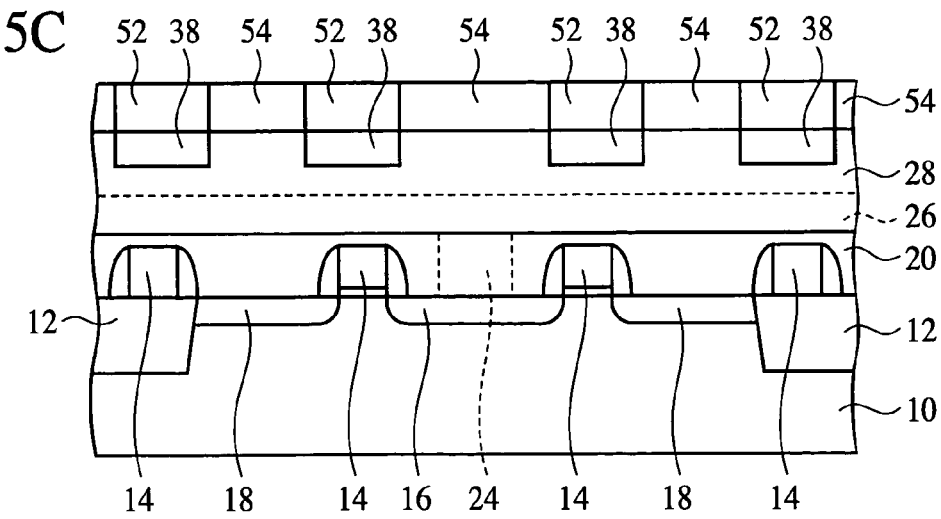

Then, on the inter-layer insulating film 28 with the MTJ elements 52 formed on, a silicon oxide film is deposited by, e.g., CVD method, and then the silicon oxide film is planarized by CMP method until the MTJ elements are exposed to thereby form an inter-layer insulating film 54 of the silicon oxide film having the surface planarized (FIG. 15C).

Next, by photolithography and dry etching, contact holes 56 are formed in the inter-layer insulating films 54, 28, 20 down to the source/drain regions 18.

Figure 16A:
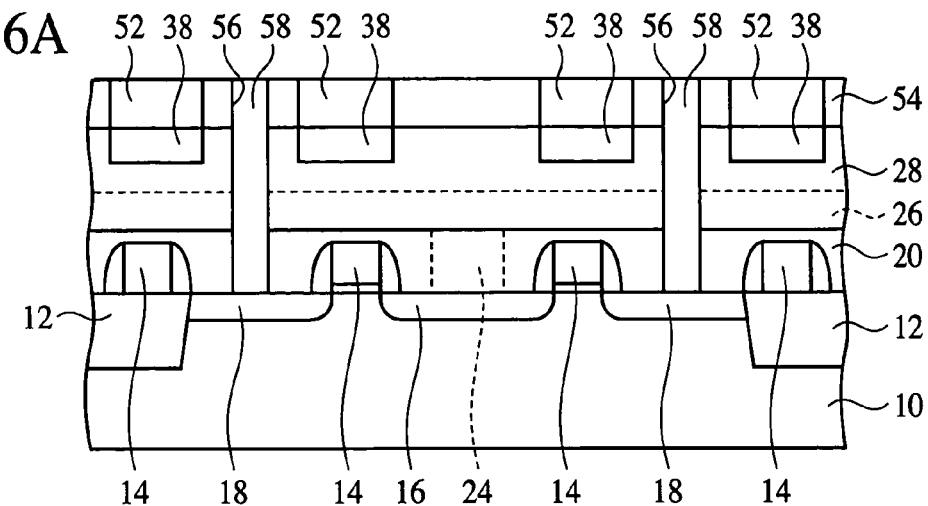

Then, by, e.g., CVD method, a titanium nitride film as the barrier metal and a tungsten film are deposited, and these conducting films are etched back or polished back to form contact plugs 58 buried in the contact holes 56 and electrically connected to the source/drain regions 18 (FIG. 16A).

Figure 16B:
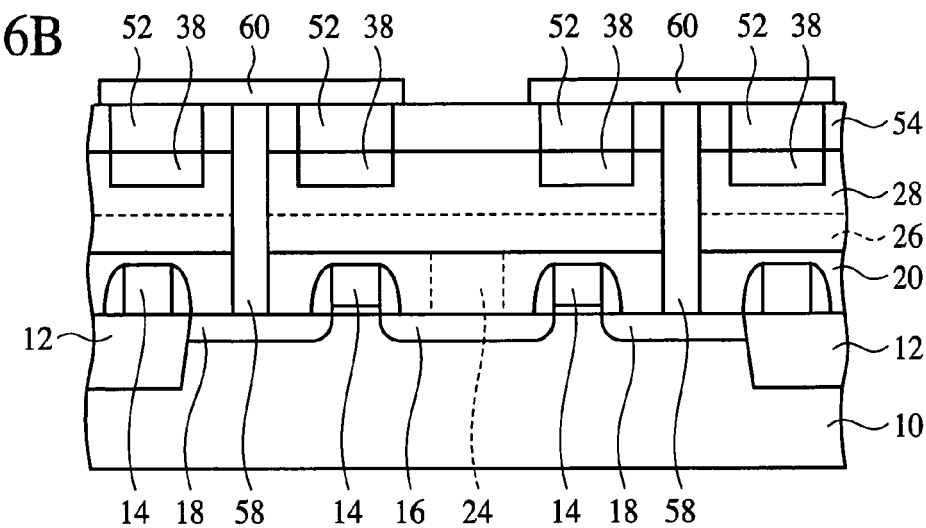

Next, on the inter-layer insulating film 54 with the MTJ elements 52 and contact plugs 58 buried in, a Ta film is deposited by, e.g., sputtering method and patterned. Thus, an upper electrode layer 60 is formed, electrically connected to the source drain regions 18 via the contact plugs 58 and interconnecting in parallel couples of the MTJ elements 52 adjacent to each other each with the contact plugs 58 therebetween (FIG. 16B). In patterning the upper electrode layer 60, a $Cl_2$/Ar-based etching gas, for example, is used.

Next, on the inter-layer insulating film 54 with the upper electrode layer 60 formed on, a silicon oxide film is deposited by, e.g., CVD method, and the surface of the silicon oxide film is planarized by, CMP method to form an inter-layer insulating film 62.

Figure 16C:
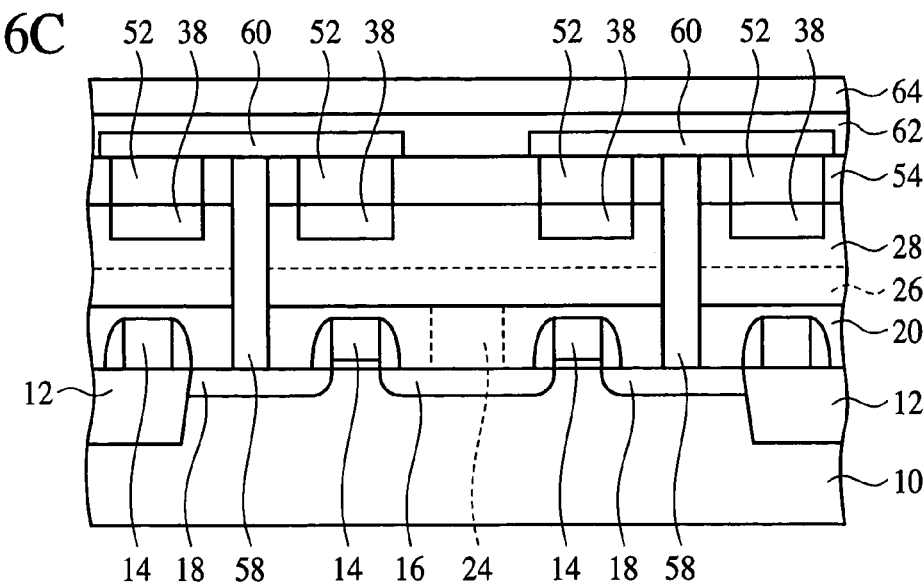
Figure 17:
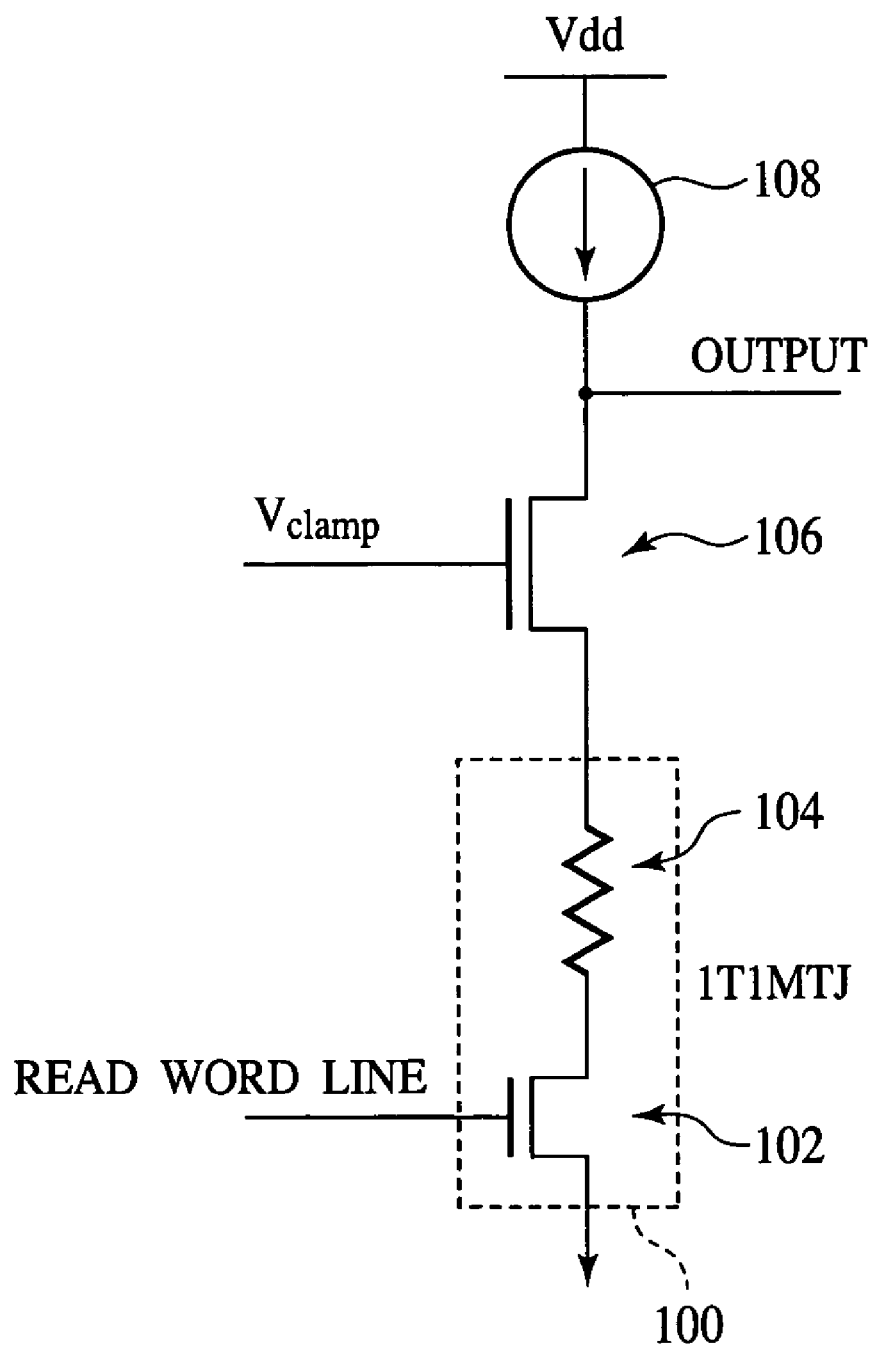
FIGS. 17-19 are circuit diagrams of the conventional magnetic memory devices, which show the structure thereof.
Figure 18:
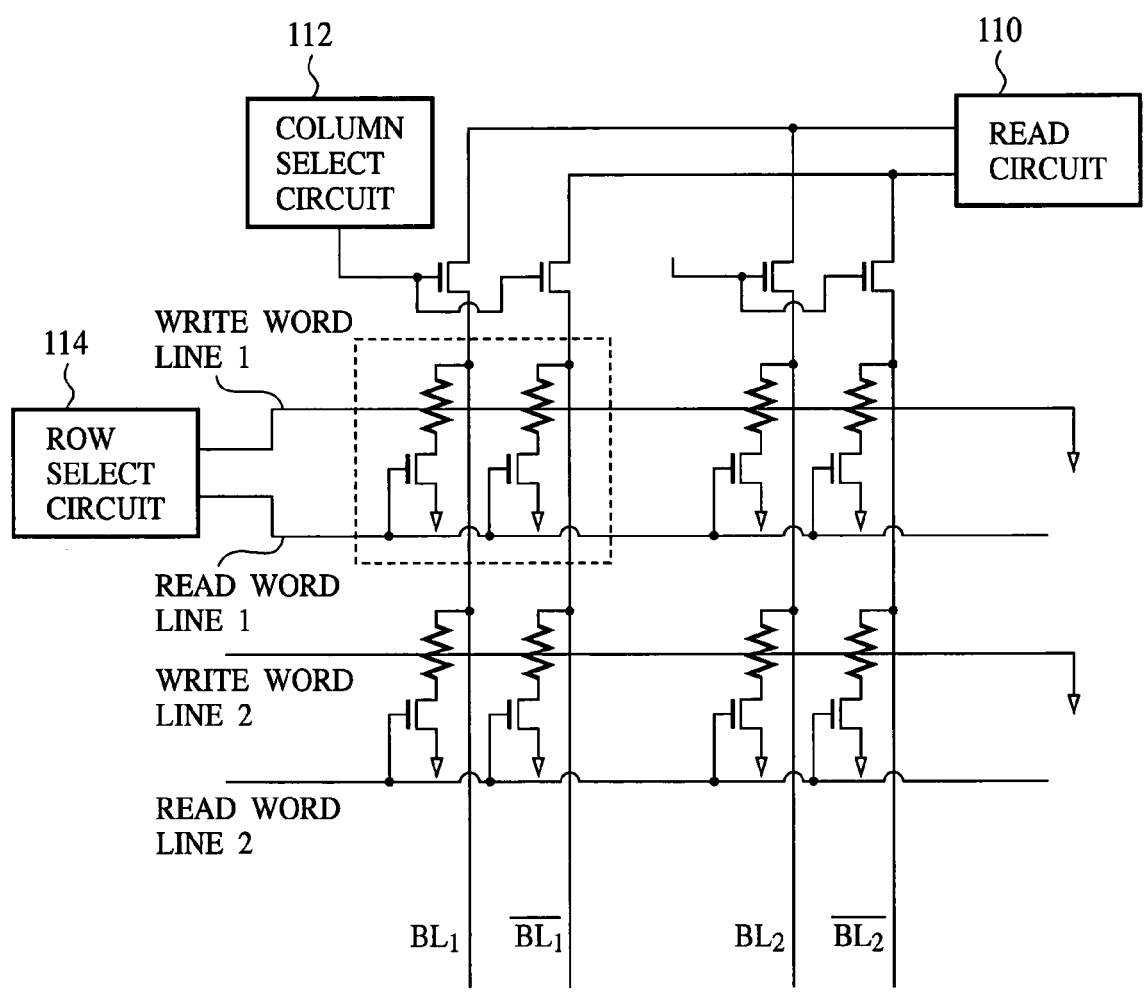
Figure 19:
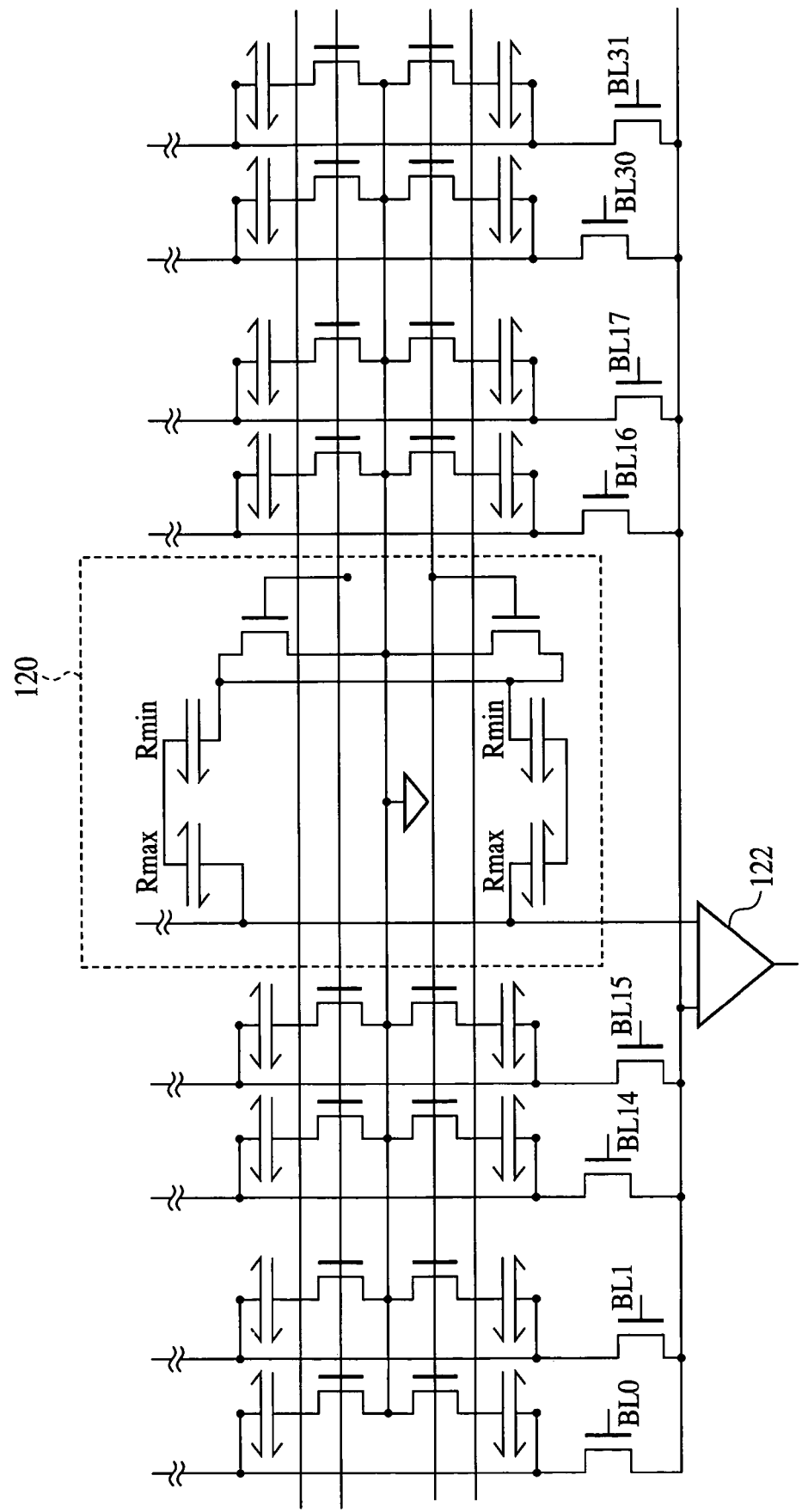

Next, a conducting film is deposited on the inter-layer insulating film 62 and patterned to from the digit lines 64 (DL) (FIG. 16C). As shown in FIG. 1, the digit lines 64 are formed in the regions between the bit lines BL and extended in parallel with the direction of extension of the bit lines BL.

As described above, according to the present embodiment, a memory cell includes 2 magnetoresistive effect elements serially connected and have states complementary with each other, and a select transistor connected to the connection node between the magnetoresistive effect elements, whereby information memorized in the magnetoresistive effect elements are read, based on a voltage of the connection node outputted via the select transistor to the bit line connected to the connection node between the first magnetoresistive effect element and the second magnetoresistive effect element. In comparison with the conventional magnetic memory device of the current sense mode, the magnetic memory device according to the present embodiment facilitates the integration.

The magnetic memory device according to the present embodiment allows the use of the folded bit line structure, whereby differential signals of the pair of the adjacent bit lines (BL, /BL) can be read by the cross connection-type sense amplifier. This makes the magnetic memory device strong to noises in the memory operation. The sense amplifier can be provided for each column, whereby data of each column is simultaneously read out and latched by the sense amplifiers to be transferred at high speed. High-speed read in the burst mode can be easily realized.

The pair of adjacent magnetoresistive effect elements is used, and a half of a read voltage is used as the reference voltage, whereby the read can be strong to the fluctuation of characteristics of the magnetoresistive effect elements.

The present invention is not limited to the above-described embodiment and can cover other various modifications.

For example, in the above-described embodiment, the present invention is applied to a magnetic memory device using MTJ elements. However, the present invention is applicable widely to magnetic memory devices using magnetoresistive effect elements using resistance changes due to spin relationships between the magnetic layers. For example, the present invention is applicable to magnetic memory devices including magnetoresistive effect elements having two magnetic layers laid with a conductive nonmagnetic layer formed therebetween.

What is claimed is:

1. A magnetic memory device comprising:
   a memory cell including:
      a first magnetoresistive effect element;
      a second magnetoresistive effect element serially connected to the first magnetoresistive effect element; and
      a select transistor connected to a connection node between the first magnetoresistive effect element and the second magnetoresistive effect element;
   a bit line connected to the connection node between the first magnetoresistive effect element and the second magnetoresistive effect element via the select transistor;
   a read circuit connected to the bit line for reading memorized information in the memory cell defined by a resistance state of the first magnetoresistive effect element and a resistance state of the second magnetoresistive effect element based on a voltage of the connection node;
   another bit line provided adjacent to said bit line and connected to the read circuit; and
   another memory cell connected to said another bit line.

2. A magnetic memory device according to claim 1, wherein
   the read circuit includes a differential amplification type sense circuit.

3. A magnetic memory device according to claim 2, wherein
   the read circuit compares the voltage of the connection node outputted to the bit line when a read voltage is applied to a serial connection of the first magnetoresistive effect element and the second magnetoresistive effect element with a reference voltage, which is a half of the read voltage, applied to said another bit line to read said memorized information.

4. A magnetic memory device comprising:
   a plurality of memory cells laid out in a matrix each including:
      a first magnetoresistive effect element;
      a second magnetoresistive effect element having one end connected to one end of the first magnetoresistive effect element; and
      a select transistor connected to a connection node between the first magnetoresistive effect element and the second magnetoresistive effect element;
   a plurality of first signal lines extended in a first direction and in parallel with each other, each of the first signal lines being connected to the other ends of the first magnetoresistive effect elements of the memory cells laid out in the first direction;
   a plurality of second signal lines laid out in the first direction and in parallel with each other, each of the second signal lines being connected to the other ends of the second magnetoresistive effect elements of the memory cells laid in the first direction;
   a plurality of third signal lines laid out in a second direction normal to the first direction and in parallel with each other, each of the third signal lines intersecting the first signal lines in regions where the first magnetoresistive effect elements of the memory cells laid out in the second direction are formed and intersecting the second signal lines in regions where the second magnetoresistive effect elements of the memory cells laid out in the second direction are formed;
   a plurality of bit lines laid out in the second direction and in parallel with each other, each of the bit lines being connected, via the select transistors, to the connection nodes of the memory cells laid out in the second direction; and
   a plurality of read circuits disposed at one ends of said plurality of bit lines for the respective couples of the adjacent ones of the bit lines.

5. A magnetic memory device according to claim 4, further comprising:
   a reference voltage generating circuit disposed at the other ends of said plurality of bit lines.

6. A magnetic memory device according to claim 4, further comprising:
   a first write current generating circuit for flowing current to the first signal lines and the second signal lines in opposite directions; and
   a second write current generating circuit for flowing to the third signal lines current in a direction corresponding to information to be memorized.

7. A magnetic memory device according to claim 4, further comprising:
   a read voltage generating circuit for applying a read voltage to the first signal lines and the second signal lines.

8. A magnetic memory device according to claim 4, further comprising
   first switching elements respectively disposed at one ends of the first signal line and the second signal line connected to the same memory cell, for electrically connecting and disconnecting the first signal line and the second signal line.

9. A magnetic memory device according to claim 8, further comprising:
   second switching elements respectively disposed at the other ends of the first signal line and the second signal line adjacent to each other and connected to the different memory cells, for electrically connecting and disconnecting the first signal lines and the second signal lines.

10. A magnetic memory device according to claim 4, further comprising:
    a plurality of word lines formed, extended in the first direction and connected to gate electrodes of the select transistors of the memory cells laid out in the first direction.

11. A magnetic memory device according to claim 4, wherein
    the select transistor of two memory cells adjacent to each other in the second direction is formed on one active region, and a bit line contact connecting the select transistor of the two memory cells and the bit lines is common between the two memory cells.

12. A magnetic memory device according to claim 11, wherein
    the active region includes a rectangular transistor forming part which is longer in the second direction and a contact part which is projected from a middle of the transistor forming part in the first direction, and the bit line contact is formed in the contact part.

13. A magnetic memory device according to claim 1, wherein
the resistance state of the first magnetoresistive effective element and the resistance state of the second magnetoresistive element have complementary resistance state with each other.

14. A magnetic memory device according to claim 4, wherein
the resistance state of the first magnetoresistive effective element and the resistance state of the second magnetoresistive element have complementary resistance state with each other.

* * * * *